(12) United States Patent
Kamio et al.

(10) Patent No.: US 8,848,049 B2
(45) Date of Patent: *Sep. 30, 2014

(54) CHARGED PARTICLE BEAM DEVICE AND METHOD FOR CORRECTING DETECTED SIGNAL THEREOF

(75) Inventors: Masato Kamio, Abiko (JP); Masashi Watanabe, Hitachinaka (JP); Yoshinobu Hoshino, Hitachinaka (JP); Shigeru Kawamata, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/993,797

(22) PCT Filed: Dec. 22, 2011

(86) PCT No.: PCT/JP2011/079765
§ 371 (c)(1),
(2), (4) Date: Jun. 13, 2013

(87) PCT Pub. No.: WO2012/093593
PCT Pub. Date: Jul. 12, 2012

(65) Prior Publication Data
US 2013/0278745 A1    Oct. 24, 2013

(30) Foreign Application Priority Data
Jan. 4, 2011   (JP) .................................. 2011-000210

(51) Int. Cl.
*H04N 11/02*    (2006.01)
*H04N 5/217*    (2011.01)
*H01J 37/28*    (2006.01)
*H01J 37/244*   (2006.01)

(52) U.S. Cl.
CPC ....... *H04N 5/217* (2013.01); *H01J 2237/24495* (2013.01); *H01J 2237/24592* (2013.01); *H01J 37/28* (2013.01); *H01J 37/244* (2013.01)
USPC .......................................................... 348/80

(58) Field of Classification Search
CPC ..................................................... H01J 37/244
USPC .......................................................... 348/80
See application file for complete search history.

(56) References Cited

U.S. PATENT DOCUMENTS 4,907,287 A * 3/1990 Homma et al. ................ 382/255
5,523,568 A    6/1996 Ichikawa et al.
(Continued)

FOREIGN PATENT DOCUMENTS

DE  11 2010 005 246 T5   5/2013
JP       2008-177064 A    7/2008
(Continued)

*Primary Examiner* — William C Vaughn, Jr.
*Assistant Examiner* — Luis M Perez
(74) *Attorney, Agent, or Firm* — Mattingly & Malur, PC

(57) ABSTRACT

A charged particle beam device of the present invention has a signal processing function of acquiring a secondary signal obtained when a charged particle beam is caused to scan at a low speed not subjected to a band limitation of an electrical signal path, and a secondary signal obtained when a charged particle beam is caused to scan at a high speed subjected to the band limitation of the electrical signal path, calculating a degradation function ($H^{-1}(s)$) between the plurality of secondary signals, and using an inverse function thereof as a correction filter; and a function of updating a parameter of the correction filter to an optimal value as needed or at given timing. Accordingly, the charged particle beam device can perform optimum image restoration even when a detector or an amplifier circuit that constitutes the electrical signal path degrades with time.

16 Claims, 22 Drawing Sheets

(56) References Cited

U.S. PATENT DOCUMENTS

| | | | |
|---|---|---|---|
| 5,794,146 A * | 8/1998 | Sevcik et al. | 455/434 |
| 6,088,176 A * | 7/2000 | Smith et al. | 360/46 |
| 6,246,481 B1 * | 6/2001 | Hill | 356/487 |
| 6,563,115 B1 * | 5/2003 | Goto et al. | 250/311 |
| 6,580,075 B2 * | 6/2003 | Kametani et al. | 250/310 |
| 8,045,785 B2 * | 10/2011 | Kitamura et al. | 382/141 |
| 8,090,186 B2 * | 1/2012 | Nagano | 382/141 |
| 2002/0044695 A1 * | 4/2002 | Bostrom | 382/240 |
| 2003/0228857 A1 * | 12/2003 | Maeki | 455/278.1 |
| 2005/0195975 A1 * | 9/2005 | Kawakita | 380/30 |
| 2008/0095358 A1 | 4/2008 | Eguchi et al. | |
| 2008/0251719 A1 | 10/2008 | Nakahira et al. | |
| 2011/0135216 A1 * | 6/2011 | Hatakeyama | 382/260 |
| 2011/0187847 A1 | 8/2011 | Bai et al. | |
| 2012/0307038 A1 | 12/2012 | Hoshino et al. | |

FOREIGN PATENT DOCUMENTS

| | | |
|---|---|---|
| JP | 2010-62106 A | 3/2010 |
| JP | 2011-165450 A | 8/2011 |
| WO | 2011/099101 A1 | 8/2011 |

* cited by examiner

Fig. 5

| No. | Detector | Amplifier Circuit | Scan Speed | Applied Filter Name | Update Date | Scan Speed Not Subjected to Band Limitation | Update Method | Parameter Coefficient (Weight) $h^{-1}$ | | | | | |
|---|---|---|---|---|---|---|---|---|---|---|---|---|---|
| | | | | | | | | $t_1$ | $t_2$ | $t_3$ | $t_4$ | ... | $t_n$ |
| 1 | BSE1 | AMP1 | TV1 | Filter001 | 20xx.xx.xx | SLOW1 | Initial Setting | 1 | -2 | 5 | -7 | ... | 0 |
| 2 | BSE1 | AMP1 | TV2 | Filter002 | 20xx.xx.xx | SLOW1 | Initial Setting | 1 | -2 | 6 | -8 | ... | 0 |
| 3 | BSE1 | AMP1 | TV3 | Filter003 | 20xx.xx.xx | SLOW1 | Initial Setting | 1 | -1 | 4 | -7 | ... | 0 |
| 4 | BSE1 | AMP2 | TV1 | Filter004 | 20xx.xx.xx | SLOW1 | Initial Setting | 1 | -1 | 5 | -8 | ... | 0 |
| 5 | BSE1 | AMP2 | TV2 | Filter005 | 20xx.xx.xx | SLOW1 | Initial Setting | 0 | 1 | -2 | 5 | ... | 0 |
| 6 | BSE1 | AMP2 | TV3 | Filter006 | 20xx.xx.xx | SLOW1 | Initial Setting | 0 | 1 | -2 | 6 | ... | 0 |
| 7 | BSE1 | AMP3 | TV1 | Filter007 | 20xx.xx.xx | SLOW1 | Initial Setting | 1 | -2 | 7 | -9 | ... | 0 |
| 8 | BSE1 | AMP3 | TV2 | Filter008 | 20xx.xx.xx | SLOW1 | Initial Setting | 1 | -2 | 8 | -10 | ... | 0 |
| 9 | BSE1 | AMP3 | TV3 | Filter009 | 20xx.xx.xx | SLOW1 | Initial Setting | 1 | -2 | 8 | -10 | ... | 0 |
| . | . | . | . | . | . | . | . | . | . | . | . | ... | . |
| . | . | . | . | . | . | . | . | . | . | . | . | ... | . |
| . | . | . | . | . | . | . | . | . | . | . | . | ... | . |
| N | BSE5 | AMP3 | TV3 | Filterxxx | 20xx.xx.xx | SLOW1 | Initial Setting | 1 | -2 | 5 | -7 | ... | 0 |

| No. | Detector | Amplifier Circuit | Scan Speed | Applied Filter Name | Creation Date | Parameter Coefficient (Weight) h⁻¹ | | | | | | | |
|---|---|---|---|---|---|---|---|---|---|---|---|---|---|
| | | | | | | $t_1$ | $t_2$ | $t_3$ | $t_4$ | $t_5$ | $t_6$ | $t_7$ | ... | $t_n$ |
| 1 | BSE2 | AMP1 | TV1 | User001 | 20xx.xx.xx | 1 | -2 | 8 | -10 | 3 | -1 | 1 | ... | 0 |
| 2 | BSE2 | AMP1 | TV2 | User002 | 20xx.xx.xx | 1 | -1 | 4 | -7 | 3 | -1 | 1 | ... | 0 |
| 3 | BSE1 | AMP1 | TV3 | SCAN003 | 20xx.xx.xx | 1 | -1 | 4 | -7 | 3 | -1 | 1 | ... | 0 |
| 4 | BSE2 | AMP2 | TV1 | SCAN004 | 20xx.xx.xx | 1 | -1 | 5 | -8 | 3 | -1 | 1 | ... | 0 |
| 5 | BSE5 | AMP1 | TV1 | SCAN005 | 20xx.xx.xx | 1 | -2 | 5 | -7 | 3 | -1 | 1 | ... | 0 |
| 6 | BSE1 | AMP1 | TV1 | User003 | 20xx.xx.xx | 1 | -1 | 4 | -7 | 3 | -1 | 1 | ... | 0 |
| 7 | BSE1 | AMP1 | TV2 | User004 | 20xx.xx.xx | 0 | 1 | -2 | 6 | -8 | 3 | -1 | ... | 0 |
| 8 | BSE2 | AMP3 | TV2 | TV001 | 20xx.xx.xx | 0 | 1 | -2 | 5 | -7 | 3 | -1 | ... | 0 |
| 9 | BSE1 | AMP3 | TV3 | TV002 | 20xx.xx.xx | 1 | -1 | 5 | -8 | 3 | -1 | 1 | ... | 0 |
| . | . | . | . | . | . | . | . | . | . | . | . | . | . | . |
| . | . | . | . | . | . | . | . | . | . | . | . | . | . | . |
| . | . | . | . | . | . | . | . | . | . | . | . | . | . | . |
| N | BSE5 | AMP3 | TV3 | User005 | 20xx.xx.xx | 1 | -2 | 5 | -7 | 3 | -1 | 1 | ... | 0 |

List of Default Correction Filters Generated in the Past

| | Update Date | Update Method | Filter Name | Detector | Amplifier Circuit | Scan Speed | Parameter Coefficient (Weight) h⁻¹ | | | | | | | |
|---|---|---|---|---|---|---|---|---|---|---|---|---|---|---|
| | | | | | | | $t_1$ | $t_2$ | $t_3$ | $t_4$ | $t_5$ | $t_6$ | $t_7$ | ... | $t_n$ |
| ○ | 20xx.xx.xx | Batch | Filter095 | BSE1 | AMP2 | TV2 | 1 | -2 | 5 | -7 | 3 | -1 | 1 | ... | 0 |
| ○ | 20xx.xx.xx | Real-Time | Filter095 | BSE1 | AMP2 | TV2 | 1 | -2 | 6 | -8 | 3 | -1 | 1 | ... | 0 |
| ○ | 20xx.xx.xx | Batch | Filter095 | BSE1 | AMP2 | TV2 | 1 | -1 | 4 | -7 | 3 | -1 | 1 | ... | 0 |
| ○ | 20xx.xx.xx | Partial | Filter095 | BSE1 | AMP2 | TV2 | 1 | -1 | 5 | -8 | 3 | -1 | 1 | ... | 0 |
| ● | 20xx.xx.xx | Partial | Filter095 | BSE1 | AMP2 | TV2 | 0 | 1 | -2 | 5 | -7 | 3 | -1 | ... | 0 |
| ○ | 20xx.xx.xx | Batch | Filter095 | BSE1 | AMP2 | TV2 | 1 | -2 | 7 | 6 | -8 | 3 | 1 | ... | 0 |
| ○ | 20xx.xx.xx | Batch | Filter095 | BSE1 | AMP2 | TV2 | 1 | -2 | 8 | -9 | 3 | -1 | 1 | ... | 0 |
| ○ | 20xx.xx.xx | Batch | Filter095 | BSE1 | AMP2 | TV2 | 1 | -2 | 8 | -10 | 3 | -1 | 1 | ... | 0 |
| ○ | 20xx.xx.xx | Real-Time | Filter095 | BSE1 | AMP2 | TV2 | 1 | -2 | 8 | -10 | 2 | 0 | 1 | ... | 0 |
| | . | . | . | . | . | . | . | . | . | . | . | . | . | . | . |
| | . | . | . | . | . | . | . | . | . | . | . | . | . | . | . |
| ○ | | | | | | | | | | | | | | | |

Reset — 1204
Delete — 1205
Close — 1206
Enter Command — 1207

Fig. 14

List of User Correction Filters Generated in the Past — 1401

| | Creation Date | Filter Name | Detector | Amplifier Circuit | Scan Speed | Parameter Coefficient (Weight) h⁻¹ | | | | | | | |
|---|---|---|---|---|---|---|---|---|---|---|---|---|---|
| | | | | | | $t_1$ | $t_2$ | $t_3$ | $t_4$ | $t_5$ | $t_6$ | $t_7$ | ... | $t_n$ |
| ○ | 20xx.xx.xx | SCAN001 | BSE1 | AMP1 | TV1 | 1 | -2 | 5 | -7 | 3 | -1 | 1 | ... | 0 |
| ○ | 20xx.xx.xx | User005 | BSE1 | AMP1 | TV2 | 1 | -2 | 6 | -8 | 3 | -3 | 1 | ... | 0 |
| ○ | 20xx.xx.xx | User01 | BSE1 | AMP1 | TV3 | 1 | -1 | 4 | -7 | 3 | -1 | 1 | ... | 0 |
| ○ | 20xx.xx.xx | TV001 | BSE1 | AMP2 | TV1 | 1 | -1 | 5 | -8 | 3 | -1 | 1 | ... | 0 |
| ● | 20xx.xx.xx | SCAN005 | BSE1 | AMP2 | TV2 | 0 | 1 | -2 | 5 | -7 | 3 | -1 | ... | 0 |
| ○ | 20xx.xx.xx | User02 | BSE1 | AMP2 | TV3 | 0 | 1 | -2 | 6 | -8 | 3 | 1 | ... | 0 |
| ○ | 20xx.xx.xx | User009 | BSE1 | AMP3 | TV1 | 1 | -2 | 7 | -9 | 3 | -1 | 1 | ... | 0 |
| ○ | 20xx.xx.xx | TV002 | BSE1 | AMP3 | TV2 | 1 | -2 | 8 | -10 | 3 | -1 | 1 | ... | 0 |
| ○ | 20xx.xx.xx | SCAN002 | BSE1 | AMP3 | TV3 | 1 | -2 | 8 | -10 | 2 | 0 | 1 | ... | 0 |
| . | . | . | . | . | . | . | . | . | . | . | . | . | ... | . |
| . | . | . | . | . | . | . | . | . | . | . | . | . | ... | . |
| ○ | | | | | | | | | | | | | | |

1402 — Parameter Coefficient (Weight) h⁻¹
1403

1404 — Reset
1405 — Delete
1406 — Close

1407 — Filter Name:
1408 — Generate Average Filter
1409 — Enter Command

Fig. 21
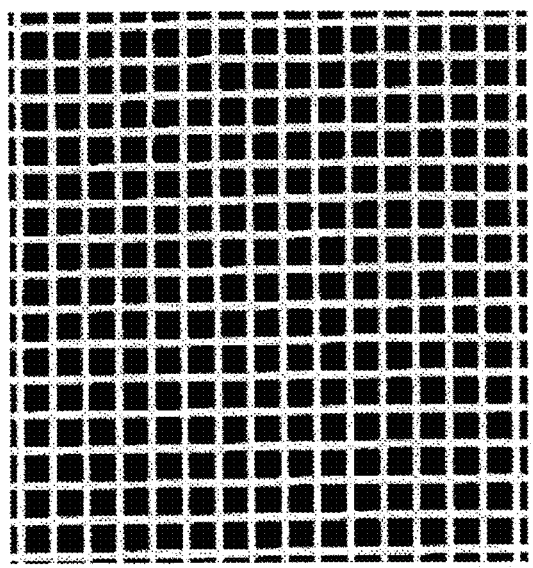
(a)
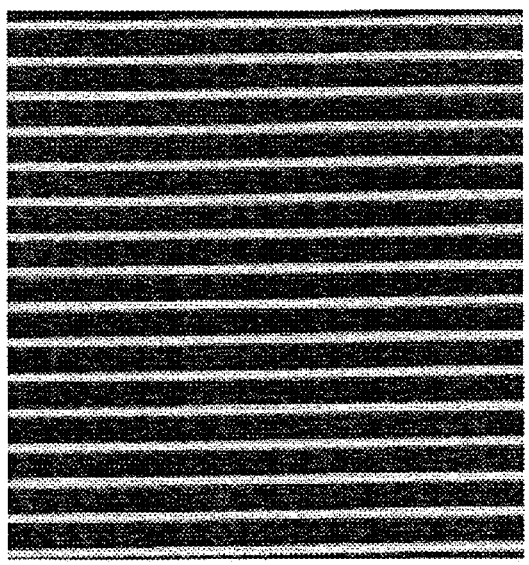
(b)
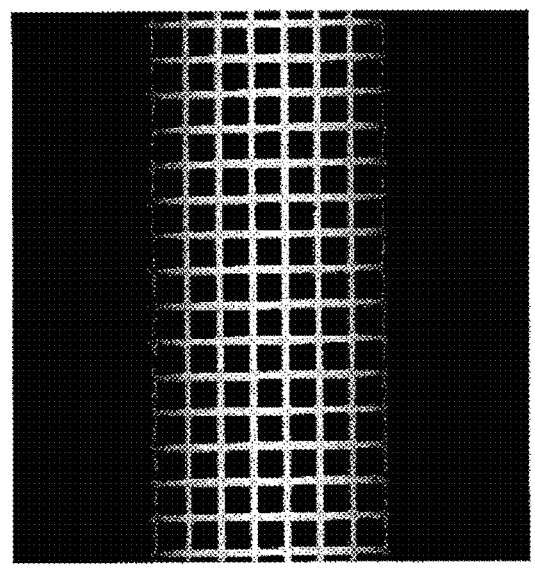
(c)
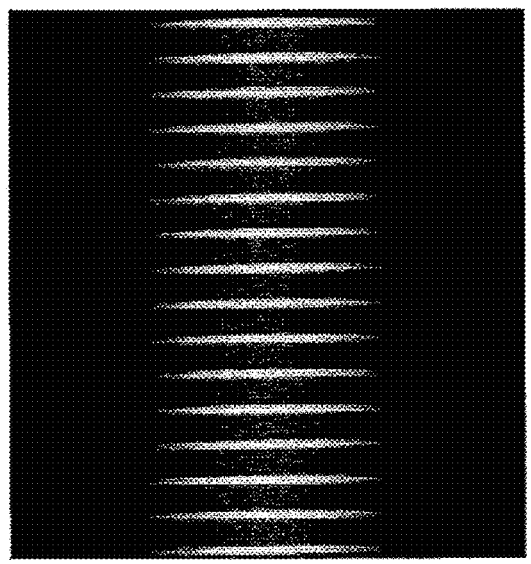
(d)

CHARGED PARTICLE BEAM DEVICE AND METHOD FOR CORRECTING DETECTED SIGNAL THEREOF

TECHNICAL FIELD

The present invention relates to a charged particle beam device that performs high-speed charged particle beam scanning, and a function of adaptively correcting degradation of a detected signal with time that is generated due to the frequency band limitation of an electrical signal path.

BACKGROUND ART

In a microscope or the like that uses a charged particle beam, scanning with a charged particle beam to irradiate a sample is performed two-dimensionally, that is, in the horizontal direction and the vertical direction, and secondary signals generated from the irradiated region are detected. The microscope amplifies the detected signals and integrates the signals using electric circuits, and then maps the integrated signals to the scan coordinates of the charged particle beam to form a two-dimensional image. At this time, the microscope or the like replaces the amplitudes of the detected signals with gray levels of image data, thereby representing the structure of the sample surface as a two-dimensional image, and displays the image on a monitor such that it is observable. It should be noted that a detected signal acquired with a detector is influenced by the transfer function of an electrical circuit in a process in which the detected signal is converted into image data.

The main factors that affect2009-the transfer function are two: a detector and an amplifier circuit. A detector has a transient response speed from the time a secondary signal is detected until the detected signal is converted into an electrical signal, and such a transient response speed has influence on the gray level of the acquired image data as a transfer function. The transfer function differs from detector to detector, depending on their types, but even detectors of the same model have different transfer functions. Meanwhile, not only an amplifier per se but also an amplifier circuit has frequency characteristics as with the detector, and such frequency characteristics have influence on the gray level of the acquired image data. Such characteristics differ depending on the type and gain value of the amplifier circuit. As described above, a frequency band-limiting filter equivalently exists on a path from the detector to the digital converter and the characteristics of such a filter have a large influence on the analysis of an image.

When a detected signal changes in a shorter time than the response speed of the detector and the amplifier circuit (i.e., a time in which the response converges) on the path, it becomes impossible for the response to follow the change of the detected signal, so that a response in which a next detected signal is convolved with the previous detected signal is output. When such a phenomenon occurs, the output image data is distorted in the scan direction of the charged particle beam, with the result that a blurred image is acquired.

Among the detectors are detectors that use various schemes such as a semiconductor detector, a scintillator, and a microchannel plate. Among them, the scintillator scheme has a higher response than the semiconductor detector, and not only has the device structure thereof been studied but also the circuit thereof has been improved to solve the aforementioned problem. However, none of such methods has led to a definitive resolution or solved the occurrence of the blurring phenomenon.

CITATION LIST

Patent Literature

Patent Literature 1: JP 2008-177064 A

SUMMARY OF INVENTION

Technical Problem

By the way, when the detected signal is changed in a longer time than the response speed of the detector and the amplifier circuit (i.e., when the frequency band of the detected signal is suppressed to be within the frequency bands of the detector and the amplifier circuit by causing a charged particle beam to scan slowly), the response of the detector and the amplifier circuit will converge within the scan time for each pixel. Thus, the aforementioned blurring phenomenon does not occur.

The applicant of the present application, focusing on such a difference, proposed a method of generating an inverse filter that corrects the frequency band limitation of a path from a detector to a digital converter by acquiring image data at two kinds of speed (JP Patent Application No. 2010-026057). Specifically, the applicant proposed a method of generating an inverse filter from non-degraded image data, which is obtained when scanning is performed at such a low speed that the response can converge, and degraded image data, which is obtained when scanning is performed at such a high speed that the response cannot converge. Then, in the scanning that is performed at such a high speed that the response cannot converge, the inverse filter generated in advance is applied to restore the degraded image in real time, so that an image without blur is generated. This method is a technique that has a significant advantageous effect on a microscope or the like for which high-speed scanning is required.

Thus, such an inverse filter is prepared in advance before a microscope or the like starts to be used. Typically, a detector and an amplifier circuit degrade with time, and a transfer function thereof also changes with time. Therefore, even when an inverse filter is optimum at a point in time when the inverse filter is prepared, there is a possibility that a discrepancy from the actual characteristics may occur with time, so that the best image restoring function may not be able to be provided eventually.

Solution to Problem

Thus, the inventors propose to provide a charged particle beam device, which has a signal processing function of acquiring a plurality of secondary signals obtained through charged particle beam scanning at different speeds, calculating a degradation function among the plurality of secondary signals, and using an inverse function thereof as a correction filter, with a function of updating a parameter of the correction filter to an optimal value as needed or at given timing so that an optimum image restoration function can be provided for a long period of time.

Advantageous Effects of Invention

According to the present invention, a charged particle beam device can be implemented that can always maintain an optimum image restoring effect even when the transfer function of an electrical signal path changes due to degradation of the electronic components that constitute the electrical signal path with time.

Other problems, configurations, and advantageous effects will become apparent from the following description of embodiments.

BRIEF DESCRIPTION OF DRAWINGS

FIG. 5 is a diagram showing an exemplary management table corresponding to default correction filters;

FIG. 6 is a diagram showing an exemplary management table corresponding to user correction filters;

FIG. 12 is a view showing an exemplary operation screen that allows management of default correction filters updated in the past;

FIG. 14 is a view showing an exemplary operation screen that allows management of user correction filters updated in the past;

FIG. 21 is a view showing an image during the process procedures shown in FIG. 20.

DESCRIPTION OF EMBODIMENTS

Hereinafter, embodiments of the present invention will be described with reference to the drawings. It should be noted that the embodiments of the present invention are not limited to those described below, and various modifications are possible within the technical spirit and scope of the present invention.

<Embodiment 1: Batch Update>

This embodiment will describe a function of performing a batch update to parameters of correction filters that correct the transfer function of an electrical signal path.

(Device Configuration)

Figure 1:
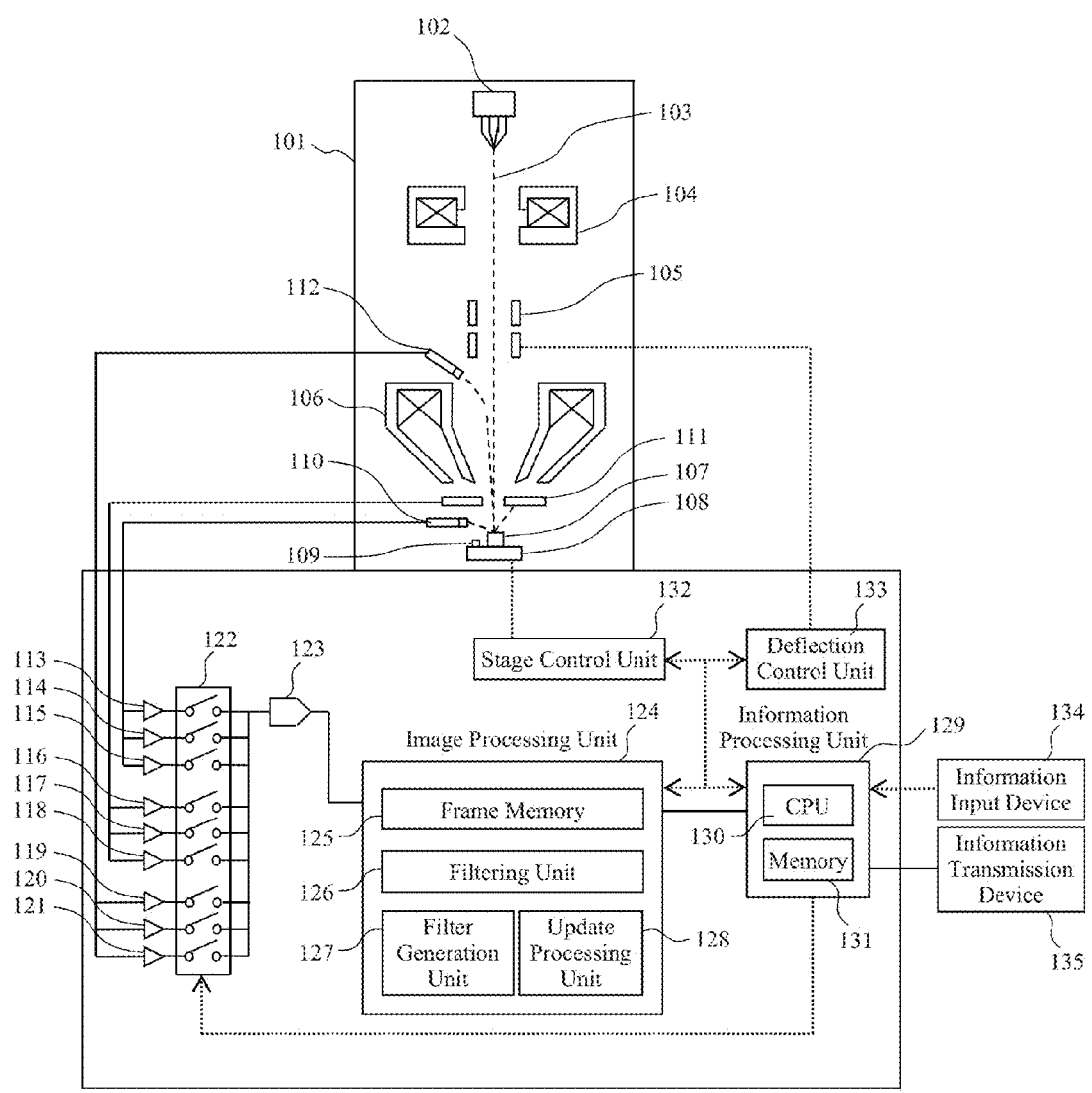
FIG. 1 is a diagram showing the configuration of a charged particle beam device in accordance with an embodiment.

FIG. 1 shows an example of a charged particle beam device in accordance with an embodiment. This device has both the image restoring function proposed in JP Patent Application No. 2010-026057 and an update process function that the applicant newly proposes. It should be noted that FIG. 1 illustrates an example of a snorkel-lens SEM (Scanning Electron Microscope).

A sample 107 is disposed on a sample stage 108 in a vacuum column 101. An electron beam 103 generated by an electron gun 102 irradiates a predetermined position of the sample 107. The electron beam 103 is converged by a converging lens 104, and is further narrowed by an objective lens 106. Deflection of the electron beam 103 is controlled by a deflection coil 105. Secondary electrons, backscattered electrons, and other secondary signals are generated from the surface of the sample 107 irradiated with the electron beam 103, and are then detected by detectors 110, 111, and 112.

The sample stage 108 is controlled by a stage control unit 132. Deflection of the electron beam 103 is controlled by a deflection control unit 133. The deflection control unit 133 changes the magnetic field intensity by controlling the deflection current supplied to the deflection coil 105, thereby causing the electron beam 103 to scan in the horizontal direction and the vertical direction. The deflection control unit 133 also supplies a signal for controlling the deflection degree (a deflection signal) to an image processing unit 124. It should be noted that the lens intensity of the converging lens 104 and the objective lens 106 are adjusted by a lens control unit (not shown).

The image processing unit 124 detects secondary signals generated in synchronism with the deflection signal scanning via the detectors 110, 111, and 112. An information processing unit 129 is connected to an information input device 134. That is, the information processing unit 129 has an interface with an external device. The information processing unit 129 manages the lens control unit (not shown), the stage control unit 132, the deflection control unit 133, and the image processing unit 124. In addition, the information processing unit 129 displays the state of each unit to be managed and the detected image on a display device (e.g., a monitor) of an information transmission device 135. Further, the information processing unit 129 executes the control of switching among the transmission path properties of the signals detected with the detectors (detected signals). That is, the information processing unit 129 executes switching of the amplifier switching circuit 122. The amplifier switching circuit 122 is used to selectively output each one of the amplifier outputs of the three systems prepared for the respective detectors to the analog digital converter 123 as described below. The amplifiers of the three systems have different frequency characteristics.

(Procedures of Batch Update)

Figure 2:
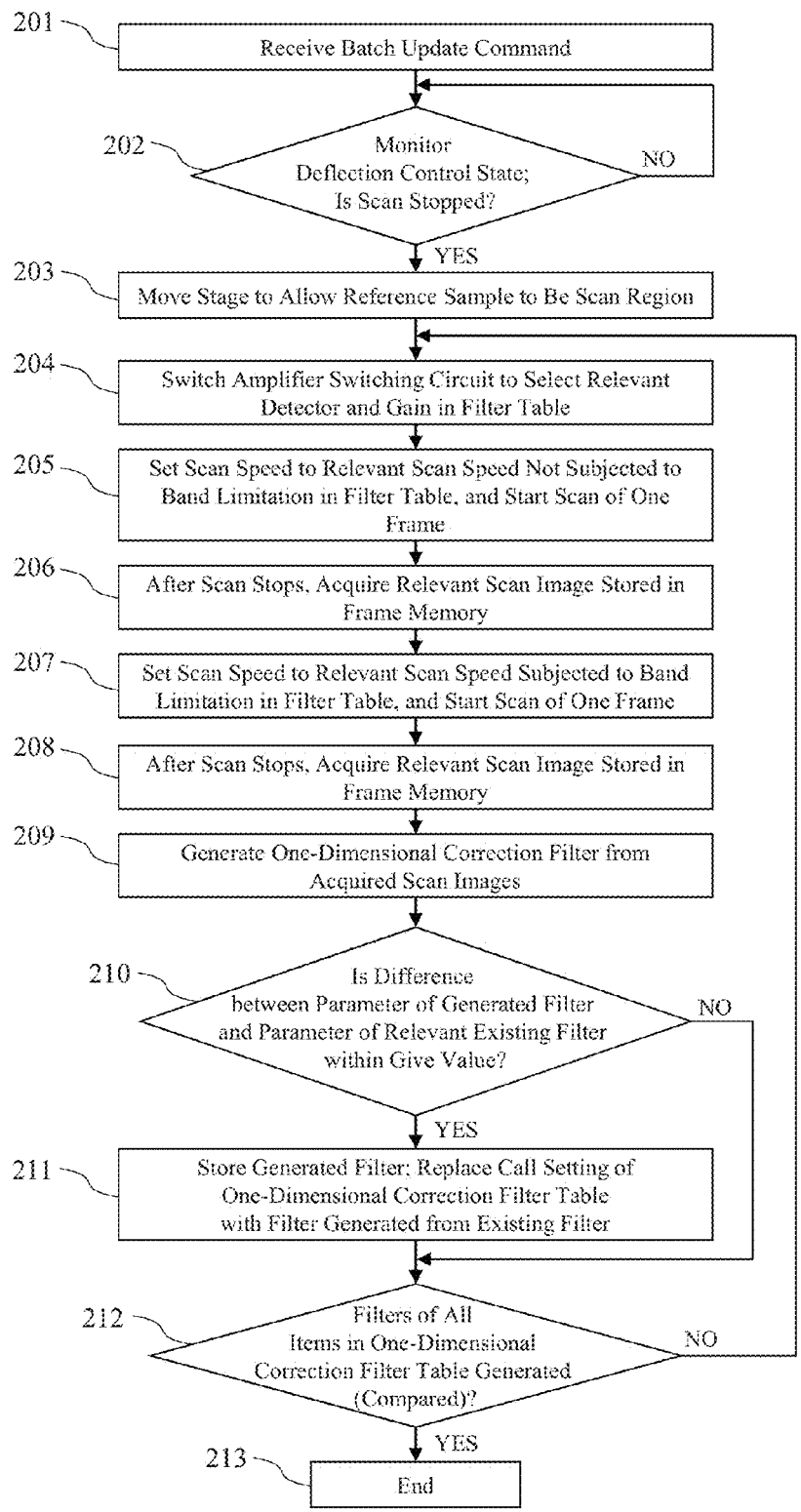
FIG. 2 is a flowchart illustrating the procedures of a batch update process for correction filters.
Figure 3:
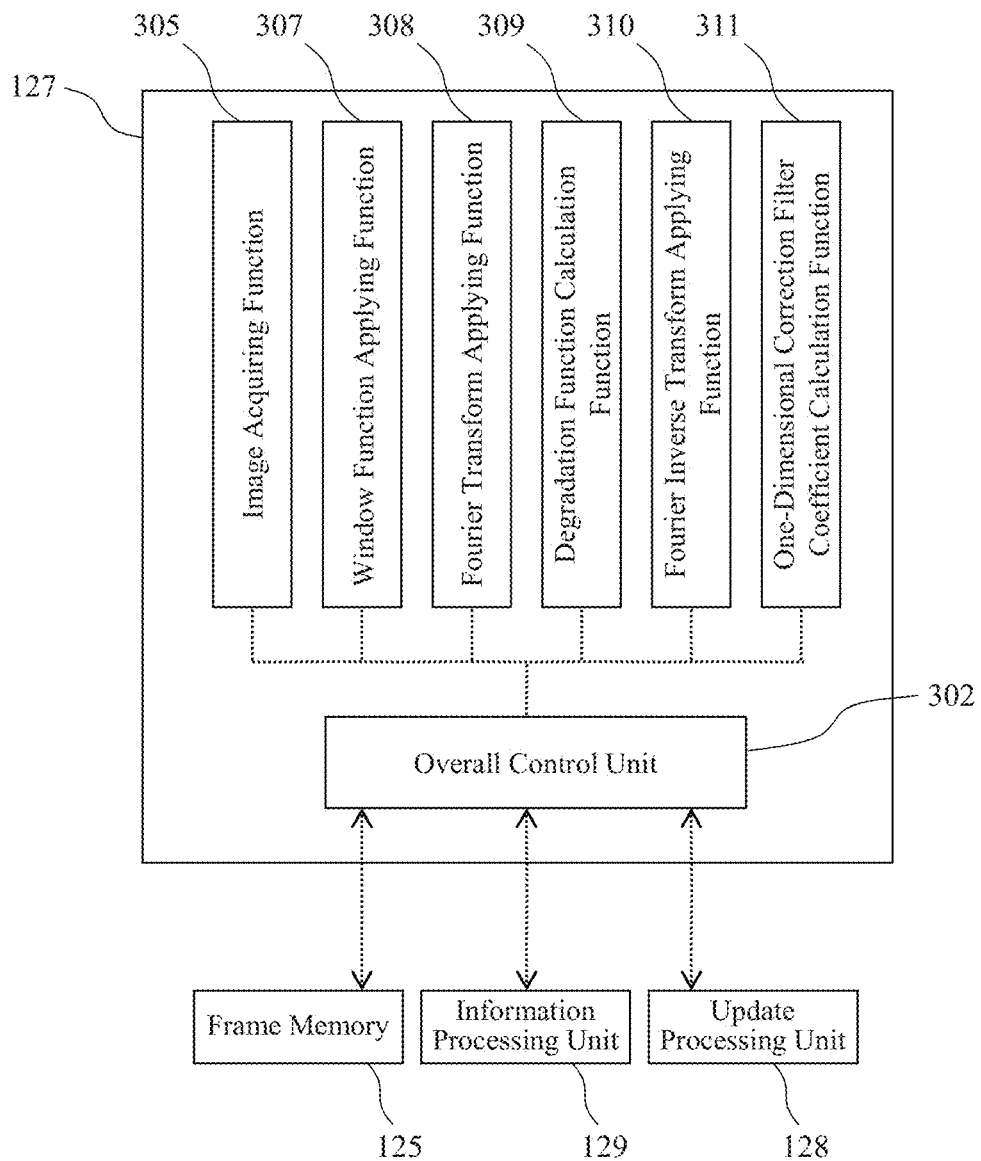
FIG. 3 is a functional block diagram of a filter generating unit having a function of generating correction filters.
Figure 4:
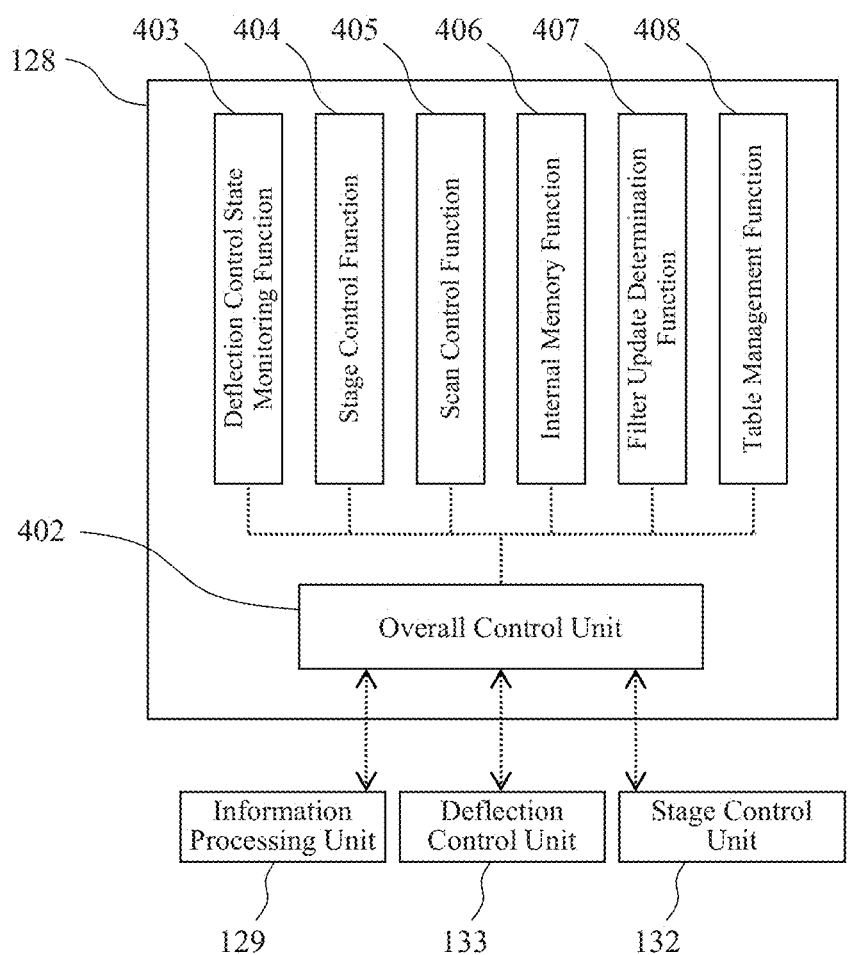
FIG. 4 is a functional block diagram of a filter updating unit having a function of updating correction filters.
Figure 8:
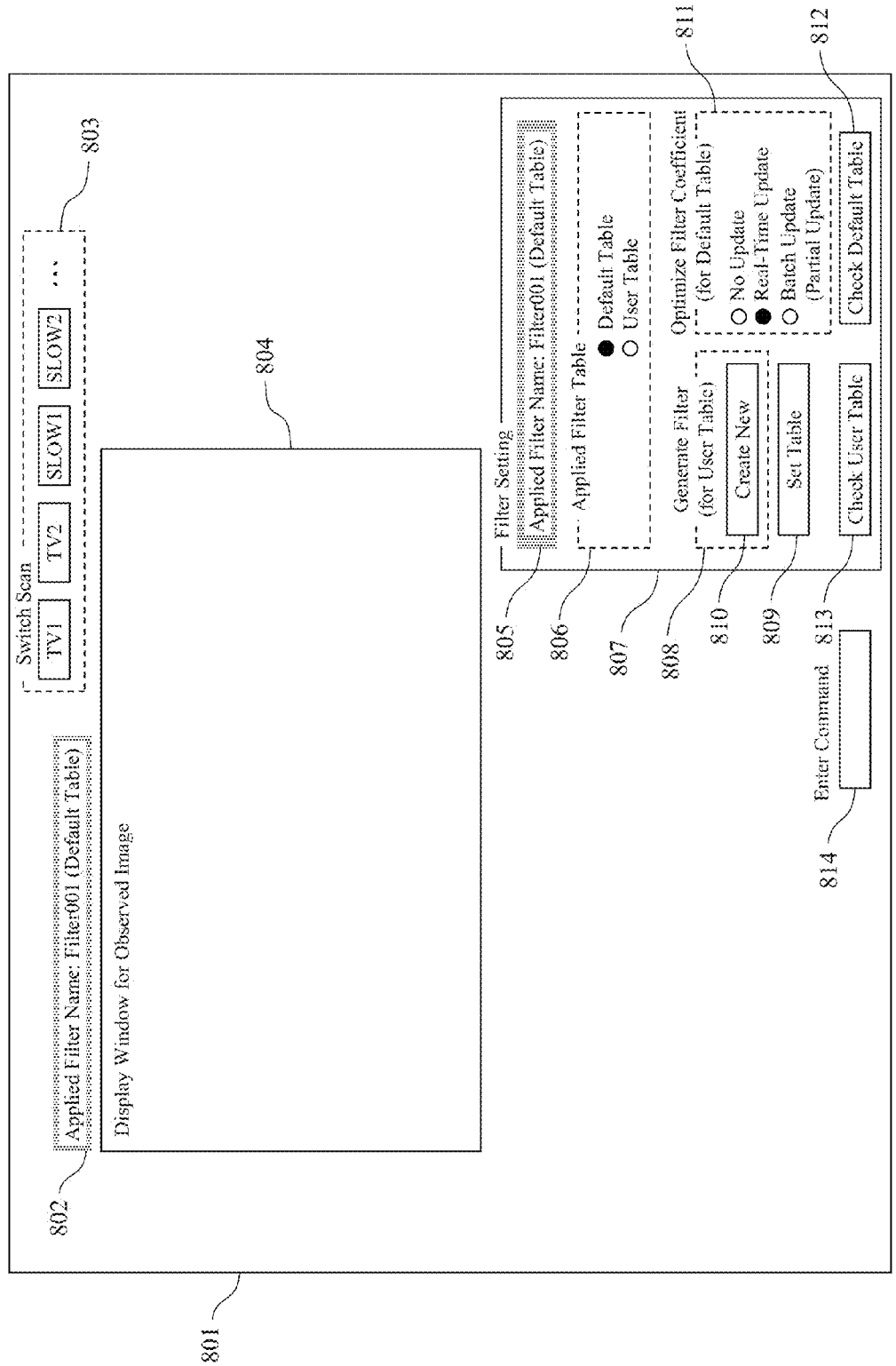
FIG. 8 is a view showing an exemplary main operation screen that concurrently displays an operation screen, which is used for the updating setting of a correction filter, and an observed image to which the correction filter is applied.
Figure 9:
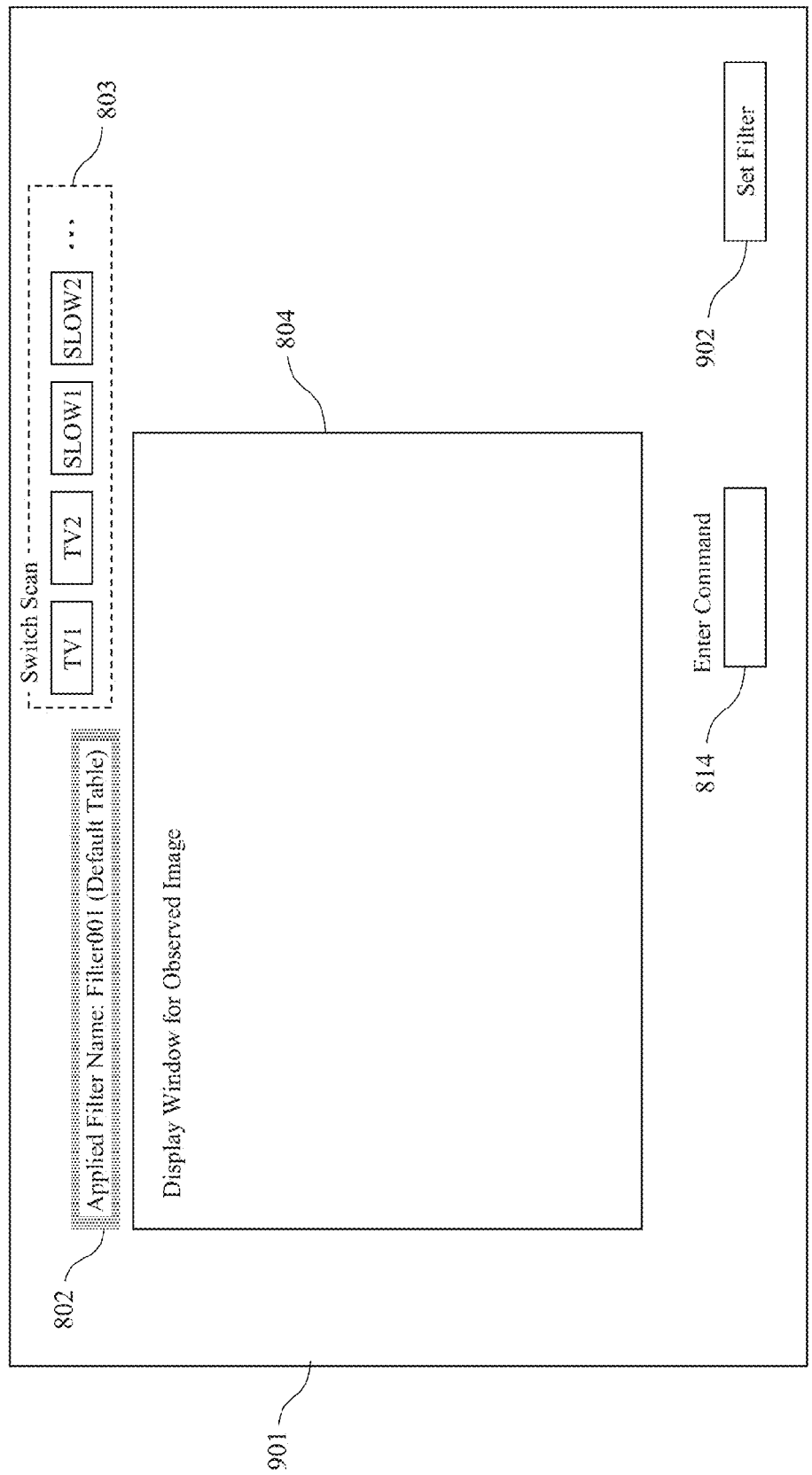
FIG. 9 is a view showing an exemplary operation screen that displays an observed image to which a correction filter is applied.
Figure 10:
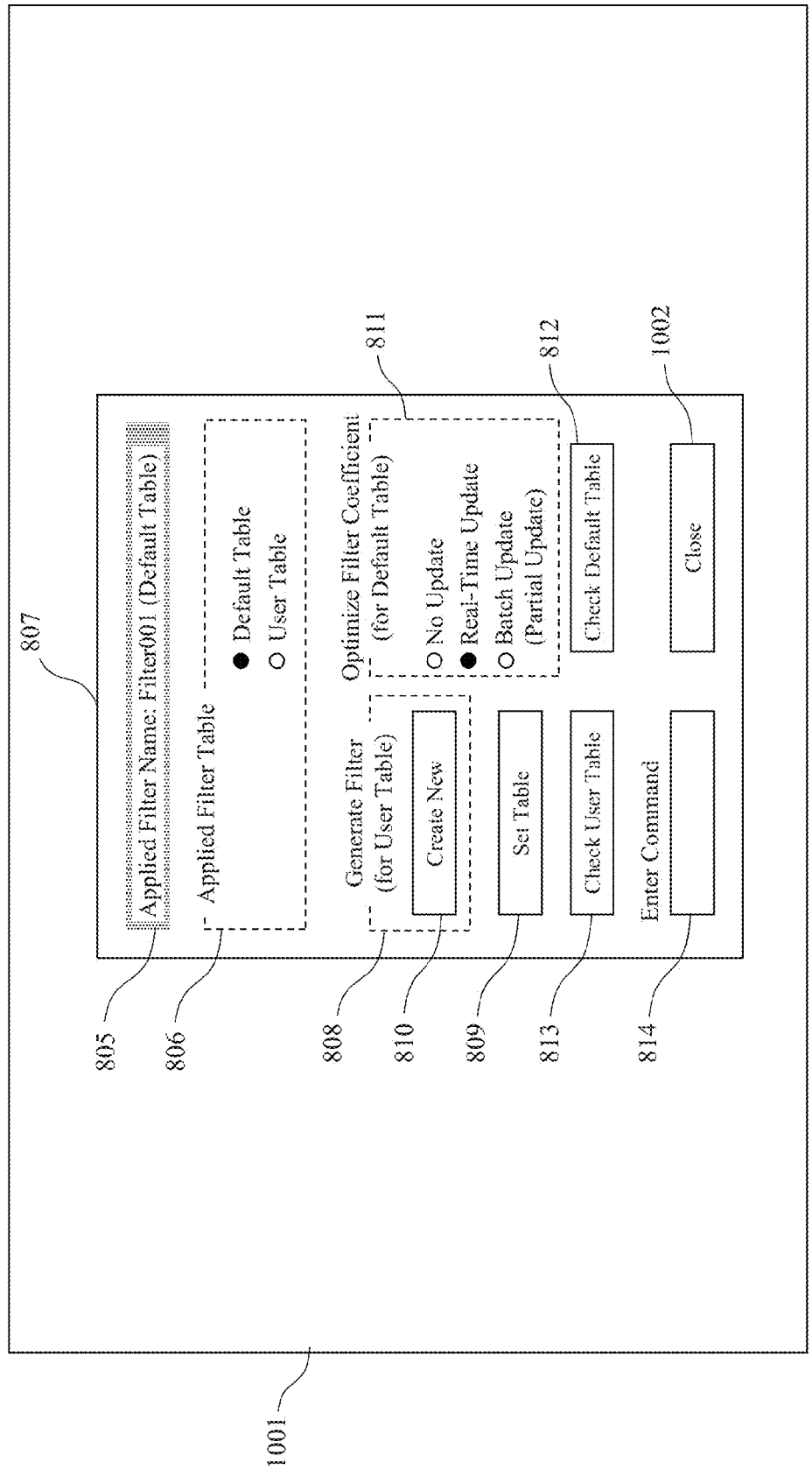
FIG. 10 is a view showing an exemplary operation screen used for management of a correction filter and a table.
Figure 11:
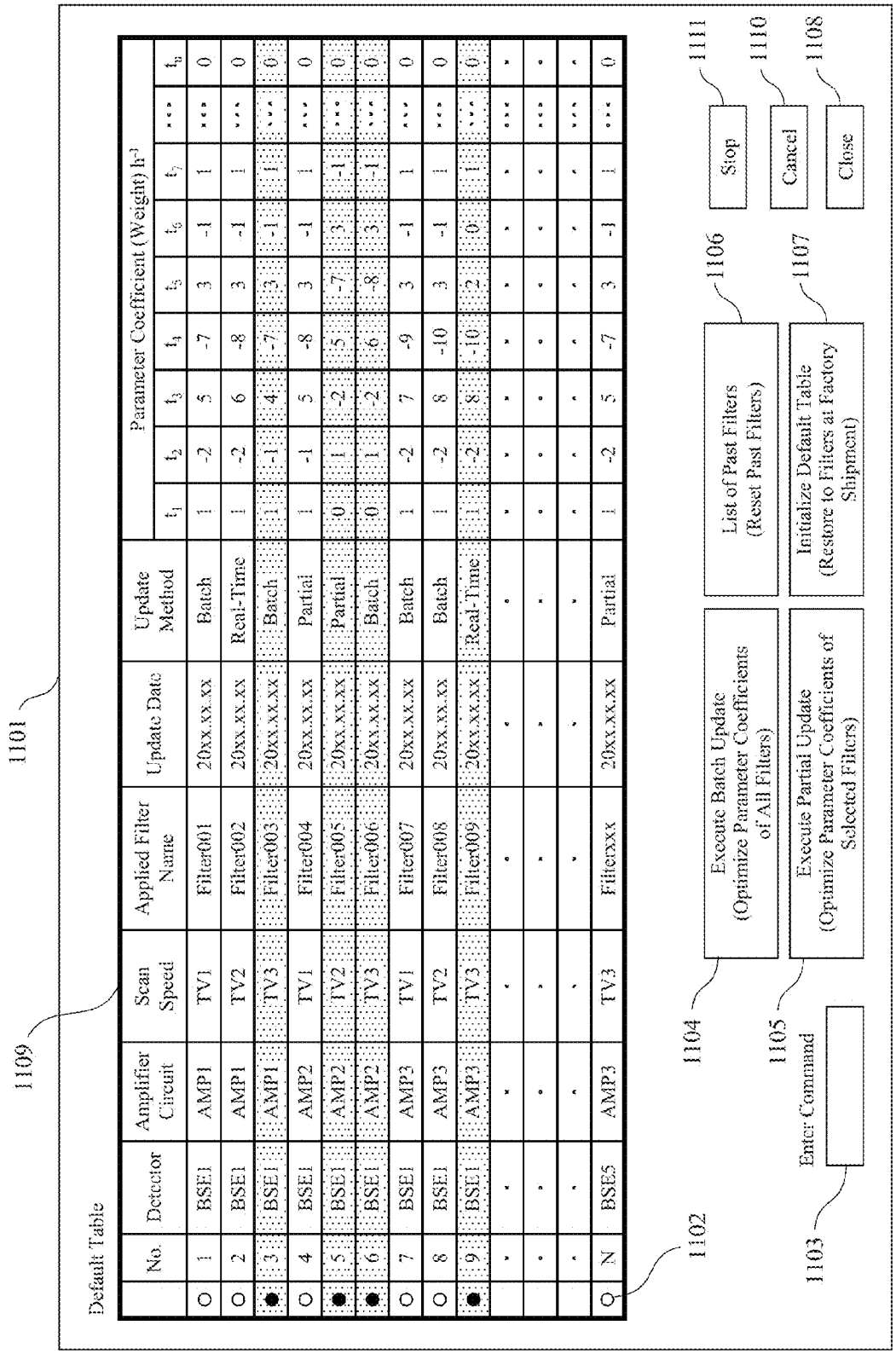
FIG. 11 is a view showing an exemplary operation screen that allows setting operations of a batch update process and a partial update process for default correction filters.

FIG. 2 shows exemplary process procedures that are executed when parameters of one-dimensional correction filters, which are used to restore a scan image, are updated in a batch. This process is implemented via the image processing unit 124 and the information processing unit 129. Among them, a functional block configuration of a filter generation unit 127 that constitutes the image processing unit 124 is shown in FIG. 3, and the functional block configuration of an update processing unit 128 is shown in FIG. 4. A default table for managing default filters is shown in FIG. 5. Examples of a main operation screen GUI associated with the filter update process function are shown in FIGS. 8 to 10. In addition, a default table operation screen GUI for correction filters is shown in FIG. 11, and an operation screen GUI adapted to listing default correction filters updated in the past is shown in FIG. 12.

The series of the process procedures shown in FIG. 2 are started upon receiving an instruction from an operator. Herein, it is assumed that the operator is opening a main operation screen GUI 801 such as the one shown in FIG. 8 to observe a sample.

The observed image is displayed on an Observation Display Window 804 of the main operation screen GUI 801. In the main operation screen GUI 801, the name of a correction filter (e.g., "Filter001"), which is applied when electron beam scanning is performed at such a high speed that the response of the detector and the amplifier cannot converge, is displayed in Applied Filter Name fields 802 and 805. In this example, a table name to which the filter belongs is also displayed. In FIG. 8, it is seen that the correction filter belongs to the "default table."

On the main operation screen GUI 801, when the operator checks a Batch Update (Partial Update) in a Filter Coefficient Optimization window 811, a default table operation screen GUI 1101 (FIG. 11) for the correction filters is called. The representation in FIG. 8 shows that the current setting is a real-time update. Next, when an Execute Batch Update button 1104 is clicked in the default table operation screen GUI 1101 (FIG. 11), a CPU 130 of the information processing unit 129 issues a batch update instruction to the update processing unit 128 of the image processing unit 124 and the deflection control unit 133. If scanning is being executed when the instruction is received, the deflection control unit 133 stops the scanning.

An overall control unit 402 (FIG. 4), upon receiving the batch update instruction (step 201), monitors the deflection control unit 133 via a deflection control state monitoring function 403, and waits until the scanning stops (step 202).

When the stop of the scanning is confirmed, the overall control unit 402 issues a command to the stage control unit 132 via a stage control function 404 so that a reference sample 109 becomes the scan region (step 203).

First, the overall control unit 402 refers to a default table 501 (FIG. 5), and controls the amplifier switching circuit 122 so that a detector and an amplifier circuit registered in the head row (item number No. 1) are selected (step 204). That is, control is performed so that a detected signal that has passed through the detector and the amplifier circuit registered in the head row are output to the ADC 123 of the subsequent stage.

In this embodiment, three systems of amplifiers 113, 114, and 115 with different gains are connected to the detector 110, three systems of amplifiers 116, 117, and 118 with different gains are connected to the detector 111, and three systems of amplifiers 119, 120, and 121 with different gains are connected to the detector 112. That is, in FIG. 1, the amplifier switching circuit 122 can switch among a total of nine systems. Needless to say, the number of the paths that are subjected to the switching control differs depending on the types of the mounted detectors and the gains.

Hereinafter, the default table 501 (FIG. 5) will be described. The default table 501 is a table for managing correction filters prepared in advance by a manufacturer or a manufacturing company. Correction filters managed by such a table cannot be freely deleted or added by the operator. In the default table 501, a single correction filter is described in each row. An identification item number is assigned to the correction filter. The table in FIG. 5 manages item No., detector, amplifier circuit, scan speed, applied filter name, update date, scan speed not subjected to the band limitation, which is used to acquire a reference image of the correction filter, update method, filter parameter coefficients, and the like. It should be noted that the default table 501 is stored in an internal memory of the image processing unit 124, or the information processing unit 129. The number of the correction filters provided is equal to the number of combinations of detectors, amplifier circuits, and scan speed. In FIG. 5, N correction filters are managed.

Referring back to FIG. 2, the overall control unit 402 controls the deflection control unit 133 via a scan control function 405 so that the scan speed becomes a speed not subjected to the band limitation (a speed at which the response can converge) (step 205). After that, scanning of one frame is started based on the specified scan speed. In FIG. 5, SLOW 1 is set as the scan speed not subjected to the band limitation. Needless to say, the scan speed may be changed later.

When the scanning is started, a scan image detected with the detector 110, 111, or 112 is input to the image processing unit 124. The image processing unit 124 has a frame memory 125, and the input scan image is stored in the frame memory 125. After the scanning stops, the image processing unit 124 acquires the scan image stored in the frame memory 125, and stores it into an internal memory function 406 or a memory in the filter generation unit 127 (step 206).

Next, the overall control unit 402 controls the deflection control unit 133 via the scan control function 405 so that the scan speed becomes fast (a scan speed subjected to the band limitation and at which the response cannot converge) (step 207). In FIG. 5, TV1 is set as the scan speed subjected to the band limitation. After that, scanning of one frame is started based on the specified scan speed. Herein, only the scan speed is allowed to be changed. Thus, the detector and the amplifier circuit, and further, the visual field (i.e., coordinates or magnification) are not allowed to be changed.

When the stop of the scanning of one frame is confirmed, the overall control unit 402 acquires the scan image stored in the frame memory 125, and stores it into the internal memory function 406 or the memory in the filter generation unit 127 (step 208).

Next, the overall control unit 402 issues an instruction to the filter generation unit 127 to generate a one-dimensional correction filter from the scan images acquired in step 206 and step 208 (step 209).

Figure 20:
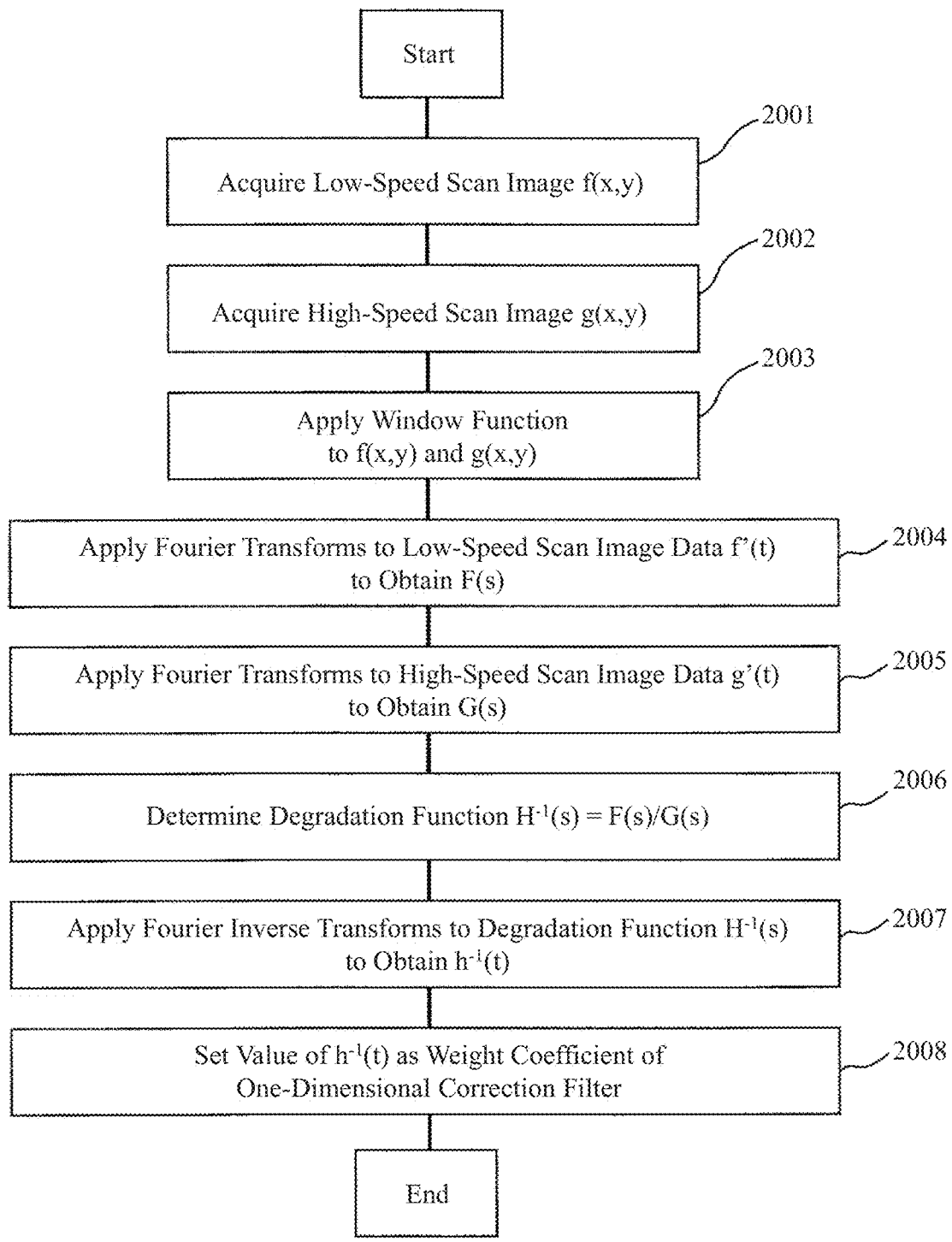
FIG. 20 is a flowchart illustrating the procedures of creating a degradation function and a one-dimensional correction filter with a filter generation unit.

Herein, the filter generation unit 127 generates a one-dimensional correction filter in accordance with the process procedures shown in FIG. 20. It should be noted that the overall operation of the filter generation unit 127 is controlled by an overall control unit 302 (FIG. 3). Hereinafter, description will be made based on FIG. 3. First, an image acquiring function 305 acquires a low-speed scan image f(x,y) (step 2001). This image is the image stored in step S206. FIG. 21(a) shows an image example of the image f(x,y). As the scan speed is low, a lattice shape in the vertical and horizontal directions can be observed clearly.

Next, the image acquiring function 305 acquires a high-speed scan image g(x,y) corresponding to the same visual field region as that of the image f(x,y) (step 2002). This image is the image stored in step 208. FIG. 21(b) shows an image example of the image g(x,y). In this example, the image is distorted in the horizontal direction (X direction). Therefore, the lattice structure in the vertical direction cannot be observed. The order of step 2001 and step 2002 is not limited, and either of them may precede the other.

Next, a window function applying function 307 applies a window function to the image f(x,y) and the image g(x,y) (step 2003). Herein, the images after the window function is applied are represented by an image f'(x,y) and an image g'(x,y), respectively. The window function is a typical process used to suppress artifacts that are influenced by an abrupt change of the start point and the end point of a signal during the process of Fourier transforms. In this embodiment, a hann window is applied to suppress a signal at the start point and the end point to zero. Accordingly, the final corrected image obtained through the filtering has suppressed artifacts in the vertical direction. Needless to say, a window function other than the harm window may also be used.

It should be noted that in the typical two-dimensional charged particle beam scanning, the electron beam 103 is first caused to scan in the horizontal direction (X direction), and then, the beam is moved by one line in the vertical direction (Y direction) so that the electron beam 103 is caused to scan the next line in the horizontal direction (X direction). Therefore, degradation of when high-speed scanning is performed is generated in the horizontal direction (X direction) in which the movement speed is high. Thus, the window function applying function 307 need not be performed two dimensionally, and has only to be executed in the horizontal direction (X direction) on a per-line basis. That is, a window function may be applied to the start point and the end point of the horizontal direction (X direction). The images in FIGS. 21(c) and 21(d) show images obtained by applying a window function to the images in FIGS. 21(a) and 21(b), respectively.

Next, a Fourier transform applying function 308 executes Fourier transforms on each line f'(t) of the image f'(x,y) in the horizontal direction (X direction) to obtain F(s) (step 2004). Likewise, the Fourier transform applying function 308 executes Fourier transforms on each line g' (t) of the image g'(x,y) in the horizontal direction (X direction) to obtain G(s) (step 2005). The order of steps 2004 and 2005 is not limited, and either of them may precede the other.

Next, a degradation function calculation function 309 calculates a degradation function $H^{-1}(s)$ from Formula 1 below (step 2006).

$$H^{-1}(s) = F(s)/G(s) \qquad \text{(Formula 1)}$$

The calculated degradation function $H^{-1}(s)$ is provided to a Fourier inverse transform applying function 310. The Fourier inverse transform applying function 310 performs Fourier inverse transforms on the degradation function $H^{-1}(s)$ to obtain $h^{-1}(s)$ (step 2007). $h^{-1}(t)$ is a function of repairing the degraded image in the real image space. Multiplying $H^{-1}(t)$ by the degraded image data g(t) can repair the degradation.

The thus calculated $h^{-1}(t)$ is provided to a one-dimensional correction filter coefficient calculation function 311. The one-dimensional correction filter coefficient calculation function 311 creates a one-dimensional correction filter by setting the values for until when the amplitude of $h^{-1}(t)$ converges to zero as the weight coefficients of the one-dimensional correction filter (step 2008).

Figure 22:
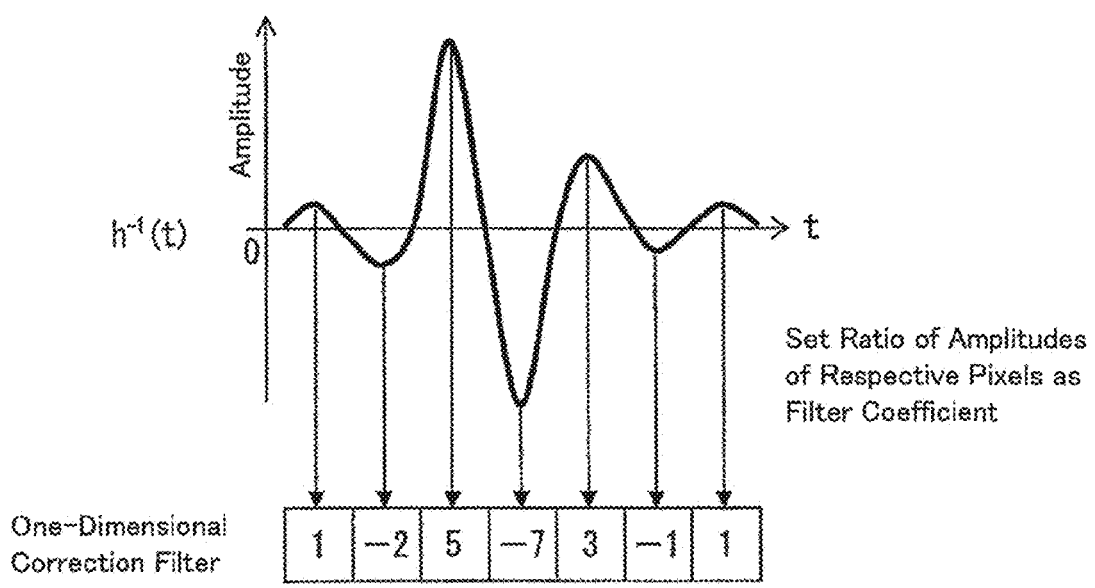
FIG. 22 is a view illustrating a method of replacing an inverse function of a degradation function with a one-dimensional correction filter.

FIG. 22 specifically shows a method of creating a one-dimensional correction filter from $h^{-1}(t)$. FIG. 22 shows an example of a case where the amplitude of $h^{-1}(t)$ converges to zero in the period of a time t corresponding to seven pixels of an image, for example. Based on the amplitude of zero as a reference, the amplitude of $H^{-1}(s)$ in the time t corresponding to the respective pixels is sampled at a ratio where the sum of the pixels becomes zero, so that weight coefficients of the one-dimensional correction filter for the respective pixels are determined. For example, when the amplitude of $h^{-1}(t_1)$ corresponding to the first pixel after the sampling is 1, the amplitude of $h^{-1}(t_2)$ corresponding to the second pixel is −2, the amplitude of $h^{-1}(t_3)$ corresponding to the third pixel is 5, the amplitude of $h^{-1}(t_4)$ corresponding to the fourth pixel is −7, the amplitude of $h^{-1}(t_5)$ corresponding to the fifth pixel is 3, the amplitude of $h^{-1}(t_6)$ corresponding to the sixth pixel is −1, and the amplitude of $h^{-1}(t_7)$ corresponding to the seventh pixel is 1, the resulting one-dimensional correction filter is a one-dimensional filter for seven pixels in which the weight coefficients of the respective pixels are given by 1, −2, 5, −7, 3, −1, and 1.

FIG. 22 shows an example in which the amplitude of $h^{-1}(t)$ converges to zero in the time t corresponding to seven pixels, but the number of the pixels for the actual one-dimensional correction filter varies depending on the degree of degradation. When the time in which the amplitude of $h^{-1}(t)$ converges to zero is long, the operator may set a range in which the amplitude of $h^{-1}(t)$ can be said to be sufficiently small as compared to the maximum value and the minimum value of the amplitude as zero so that the one-dimensional correction filter corresponds to an optimum number of pixels.

As described previously, a one-dimensional correction filter can be created from data on one line in the horizontal direction (X direction). For example, in the frame memory 125 (FIG. 1), a two-dimensional image obtained by causing the electron beam 103 to scan in the horizontal direction and the vertical direction is stored, and the number of pieces of data in the horizontal direction (X direction) corresponds to the number of scan lines in the vertical direction (Y direction). Thus, from a single two-dimensional image, one-dimensional correction filters in a number equal to the number of scan lines in the vertical direction (Y direction) can be created. Herein, the average of the one-dimensional correction filters corresponding to the respective scan lines in the vertical direction (Y direction) may also be used as the one-dimensional correction filter set on the filtering unit 126. In this case, even when the low-speed scan image f(x,y) or the high-speed scan image g(x,y) acquired to create a one-dimensional correction filter contains noise resulting from a factor other than degradation due to the band limitation of the detector and the amplifier, it is possible to create a filter with reduced influence of the noise. Alternatively, it is also possible to determine a one-dimensional correction filter by comparing the shape of each one-dimensional correction filter corresponding to each scan line in the vertical direction (Y direction) with one another, eliminating one-dimensional correction filters whose shape obviously differs from those of the others, and averaging only the one-dimensional correction filters with similar shapes. Even in such a case, the accuracy of the one-dimensional correction filter can be improved.

Referring back to FIG. 2, when generation of a new correction filter is confirmed, a filter update determination function 407 compares a parameter coefficient of the generated correction filter with a parameter coefficient of the existing filter (step 210). When the difference between the compared coefficients is within a prescribed value (if the result of step 210 is positive), the filter update determination function 407 stores the generated correction filter into a memory in the image processing unit 124 or a memory 131 in the information processing unit 129, and replaces all items associated with the item number No. 1 of the default table 501 with information on the newly generated correction filter (step 211). That is, the filter update determination function 407 replaces information on the correction filter, which is to be called in observation of a sample at a scan speed subjected to the band limitation, with information on the newly generated correction filter.

In contrast, when the difference between the compared coefficients is over the prescribed value (if the result of step 210 is negative), the filter update determination function 407 does not execute step 211, and proceeds to step 212. The prescribed value herein is prepared to determine if the generated correction filter is normal or not. When the parameter of the generated correction filter greatly differs from the parameter value of the existing filter, it is highly likely that the difference is due to a factor other than the degradation of the detector and the amplifier circuit with time. Fluctuations of a parameter due to degradation with time depend on the types of a detector and an amplifier circuit, the update execution period, and the like. Thus, the prescribed value is desirably determined taking them into consideration.

Figure 17:
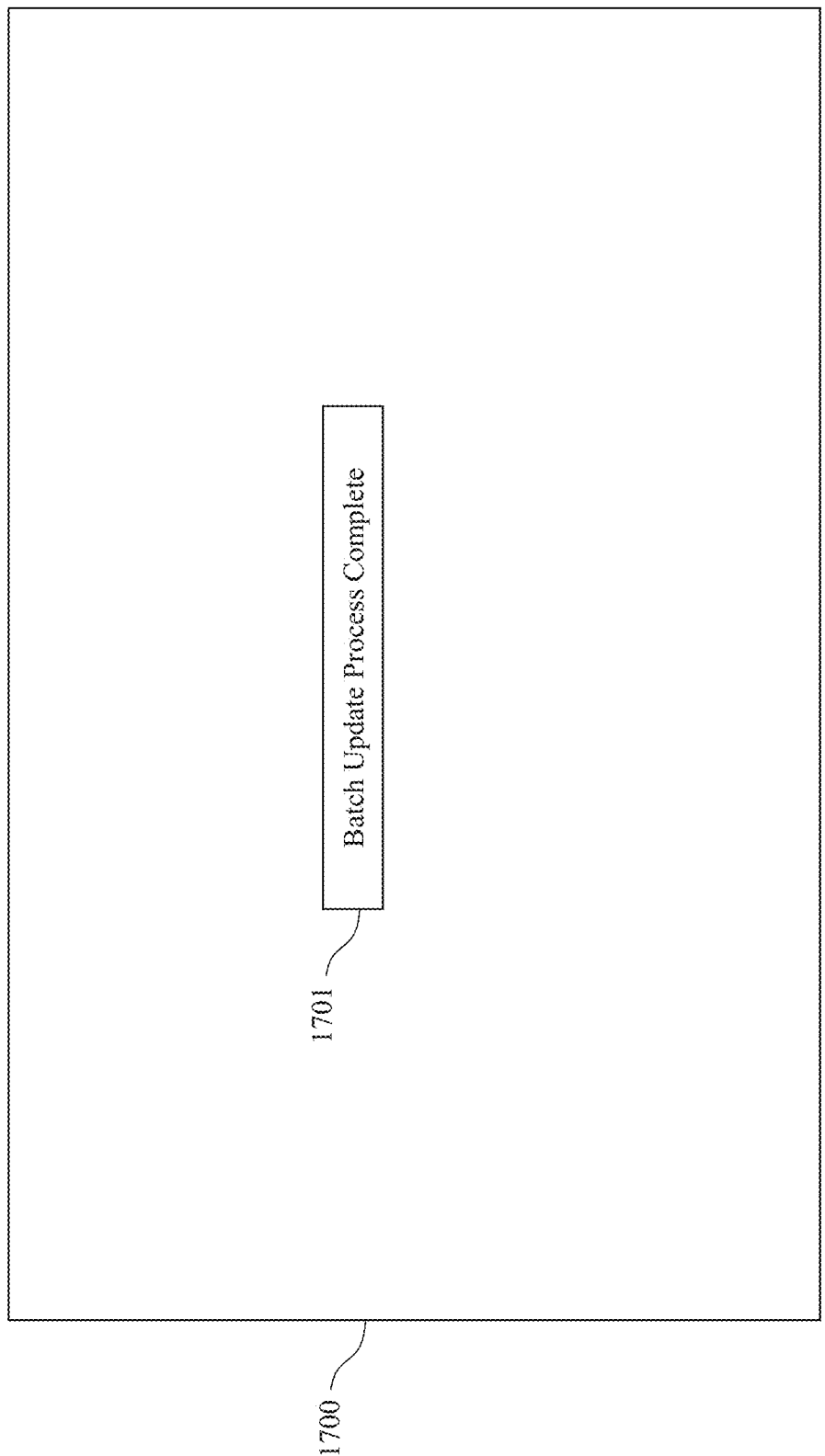
FIG. 17 is a view showing an exemplary display of a comment display window.

A table management function 408 refers to the default table 501 to check the update process statuses of the correction filters, and checks if the update process for all item numbers No. is complete. If the update process is not determined to be complete (if the result is negative), the table management function 408 instructs the overall control unit 402 to return to step 204 and start an update process for a correction filter corresponding to the next item number No. (step 212). Meanwhile, when the update process is determined to be complete (if the result is positive), the table management function 408 terminates the batch update process via the overall control unit 402 (step 213). When the batch update is complete, the overall control unit 402 may transmit the completion of the process to the operator via the information transmission device 135. For example, an operation screen 1700 including a window 1701 (FIG. 17), which shows the completion of the batch update process, may be displayed on the monitor screen. It is also possible to inform the operator of the completion of the batch update process via audio or sound output from a speaker, for example.

(Management Function using Various Tables)

In this embodiment, the default table 501 (FIG. 5) and a default table display window 1109 of the default table operation screen GUI 1101 (FIG. 11) operate in conjunction with each other, and are configured such that a change in one of them is sent to the other. When such an interlocking function is mounted, the operator is able to check an update process for a correction filter of which item No. is complete in real time even during the execution of the batch update process.

In addition, in this embodiment, a Pause button 1111, a Cancel button 1110, and other buttons are prepared on the default table operation screen GUI 1101 (FIG. 11). Thus, by operating the buttons, the operator is able to interrupt or cancel the batch update process in execution.

Besides, a button for closing the operation screen (a Close button 1108) is prepared on the default table operation screen GUI 1101 (FIG. 11). The operator is able to close the default table operation screen GUI 1101 by operating the Close button 1108. When the default table operation screen GUI 1101 is closed, the screen display returns to the main operation screen GUI 801. At this time, a check button "No Update" in the Filter Coefficient Optimization window 811 of the main operation screen GUI 801 is checked.

In the above description, a batch update process is executed through a button operation in the Filter Coefficient Optimization window 811. However, a batch update process may also be executed by entering a command into Enter Command fields 814 and 1103.

In addition, the above description illustrates a case where a batch update process is executed upon click of the Execute Batch Update button 1104 in the default table operation screen GUI 1101 (FIG. 11). However, when an update process for only a given correction filter is to be executed, an update process can be executed only for a selected correction filter by clicking a Execute Partial Update button 1105 with a check button 1102, which corresponds to the correction filter to be updated, having been selected in advance.

Default correction filters for the default table generated in the past are stored in the internal memory function 406, the memory 131 of the information processing unit 129, or the like, and may be managed via a default table filter list GUI 1201 (FIG. 12).

The default table filter list GUI 1201 (FIG. 12) can be called by clicking a List of Past Filters button 1106 in the default table operation screen GUI 1101 (FIG. 11). A display window 1202 of the default table filter list GUI 1201 displays correction filters generated in the past each time an update process was performed.

When a correction filter generated in the past is to be deleted, the operator may select a check button 1203 of the corresponding correction filter and click a Delete button 1205. When the Delete button 1205 is clicked, the corresponding correction filter is deleted from the internal memory.

Meanwhile, when a correction filter generated in the past is to be reset on the existing default table 501, the operator may select the check button 1203 of the corresponding correction filter and click a Reset button 1204. When the Reset button 1204 is clicked, the CPU 130 of the information processing unit 129 outputs an instruction to the table management function 408 to reset a filter. The table management function 408, upon receiving the instruction to reset the filter, replaces the corresponding correction filter in the default table 501 with information on the correction filter selected as the reset target. Accordingly, it is possible to manage the correction filters generated in the past and reset the correction filters on the default table 501. It should be noted that the initial correction filters registered at factory shipment can by no means be deleted.

When the default table 501 is to be restored to the state at factory shipment (initial state), the operator may click an Initialize Default Table button 1107 in the default table operation screen GUI 1101 (FIG. 11). When the initialization button is clicked, the CPU 130 of the information processing unit 129 outputs an initialization instruction to the table management function 408. The table management function 408, upon receiving the initialization instruction, replaces information corresponding to all item numbers No. in the default table 501 with the corresponding initial correction filters.

In any of the aforementioned cases, when a sample is observed at a scan speed subjected to the band limitation (when scanning is performed at a scan speed at which the response cannot converge), a correction filter corresponding to the combination of a detector, an amplifier circuit, and a scan speed is called from the updated default table 501, and is set as a correction filter of the filtering unit 126 of the image processing unit 124. After that, when the detected image is input to the image processing unit 124, the correction filter is applied thereto in real time by the filtering unit 126, so that a restored image is displayed on the observation display window 804 of the main operation screen GUI 801.

Although FIG. 8 shows an exemplary configuration of the main operation screen GUI, a screen configuration 901 shown in FIG. 9 may also be used. When the main operation screen GUI has the configuration shown in FIG. 9, the screen may be configured such that when the operator clicks a Set Filter button 902, a filter setting operation window 807 is called as shown in a filter setting operation screen GUI 1001 (FIG. 10).

Meanwhile, when the operator clicks a Check Default Table button 812 in the main operation screen GUI 801 (FIG. 8), the default table operation screen GUI 1101 (FIG. 11) can also be called. In such a case, the operator is able to easily check information on a correction filter corresponding to the combination of a detector, an amplifier circuit, and a scan speed via the default table operation screen GUI 1101.

(Conclusion)

Figure 19:
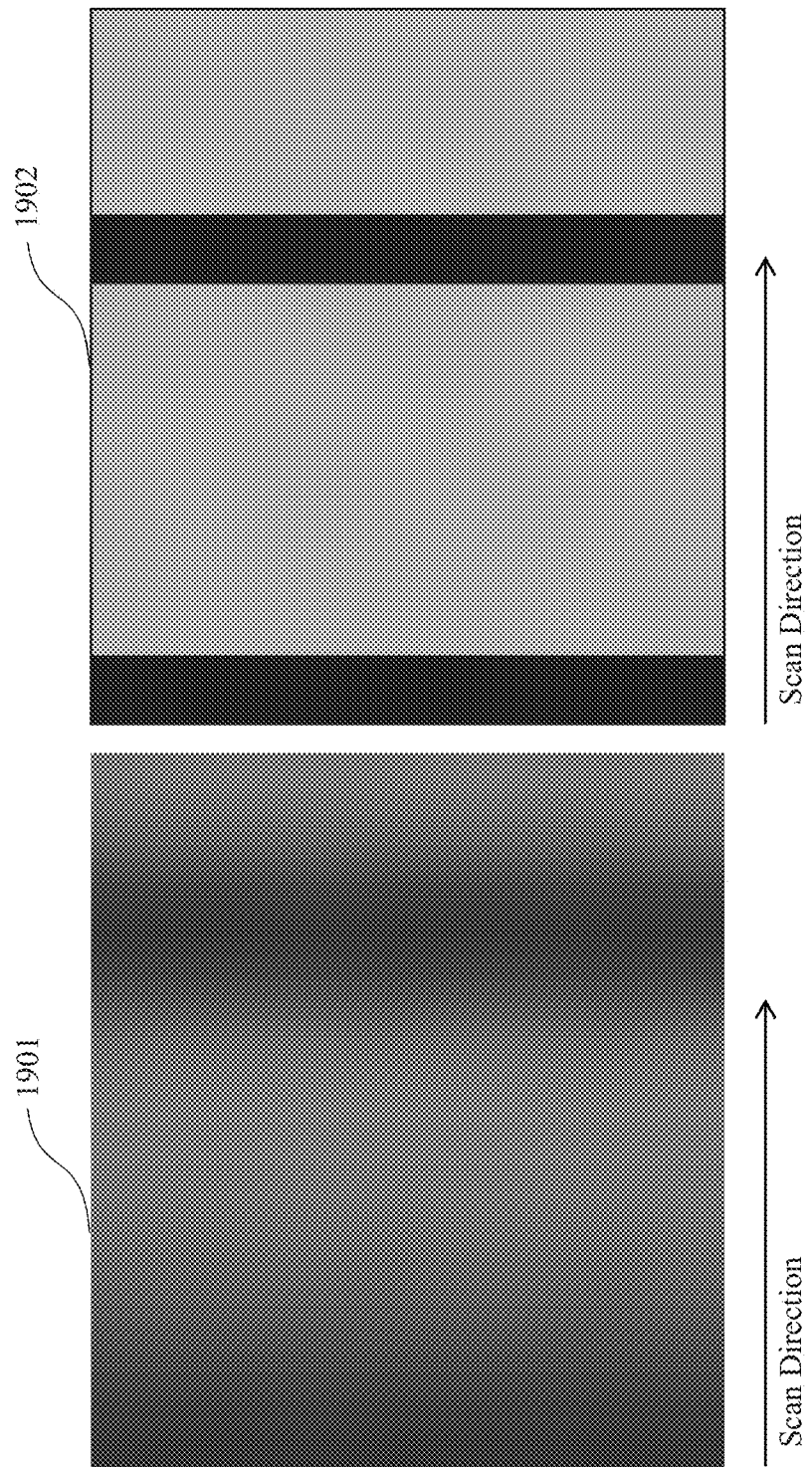
FIG. 19 is a view illustrating the effect of applying a correction filter.

FIG. 19 shows an image of a correction effect provided by the image restoring function. The right view shows an image 1902 acquired through scanning at a scan speed not subjected to the band limitation, and the left view shows an image 1901 acquired through scanning at a scan speed subjected to the band limitation. As described previously, when scanning is performed at a scan speed subjected to the band limitation (scanning in which a detected signal changes in a shorter time than the time in which the response of the detector and the amplifier circuit converges), it is impossible for the response to follow the change of the detected signal, so that a response in which a next detected signal is convolved with the current detected signal is output. When such a phenomenon occurs, the output image data is distorted in the scan direction of the charged particle beam, resulting in a blurred image 1901.

Meanwhile, when scanning is performed at a scan speed not subjected to the band limitation (scanning in which a detected signal changes in a longer time than the time in which the response of the detector and the amplifier circuit converges), the response will converge within the scan time for each pixel. Thus, the blurring phenomenon does not occur.

If image restoration can be performed by applying a correction filter that covers all frequency bands to the image 1901, it is possible to restore the same image as the image 1902 that is obtained through scanning at a scan speed not subjected to the band limitation.

In addition, as described previously, individual components of even detectors or amplifier circuits of the same type have not exactly the same transfer functions and thus have difference. Therefore, it is necessary to prepare correction filters that match the individual device configurations at the time of the initial setting, replacing components, adding options, maintenance, and the like. Further, there are also cases where a transfer function fluctuates due to the influence of degradation with time, with the result that the content of a correction filter prepared in advance becomes not suitable for the correction of the current transfer function.

However, as the scanning electron microscope in accordance with this embodiment has mounted thereon a function of performing a batch update to correction filters, it is possible to always provide optimal correction filters by executing such a function. Thus, a scan image can always be observed in optimum conditions.

In addition, as the scanning electron microscope in accordance with this embodiment has various scan screen GUIs, it is also possible to improve the operability of the management of correction filters (e.g., information checking, creation, batch change, partial change, reset, deletion, initialization, and checking of the update progress).

<Embodiment 2: Real-Time Update>

This embodiment will describe a function of updating a parameter of a correction filter for correcting a transfer function of an electrical signal path in real time on the background of sample observation.

(Device Configuration)

Next, a charged particle beam device having a real-time update function will be described. It should be noted that the configuration of the charged particle beam in accordance with this embodiment is the same as the configuration shown in FIG. 1 except for the details of the process functions.

(Procedures of Real-Time Update)

Figure 7:
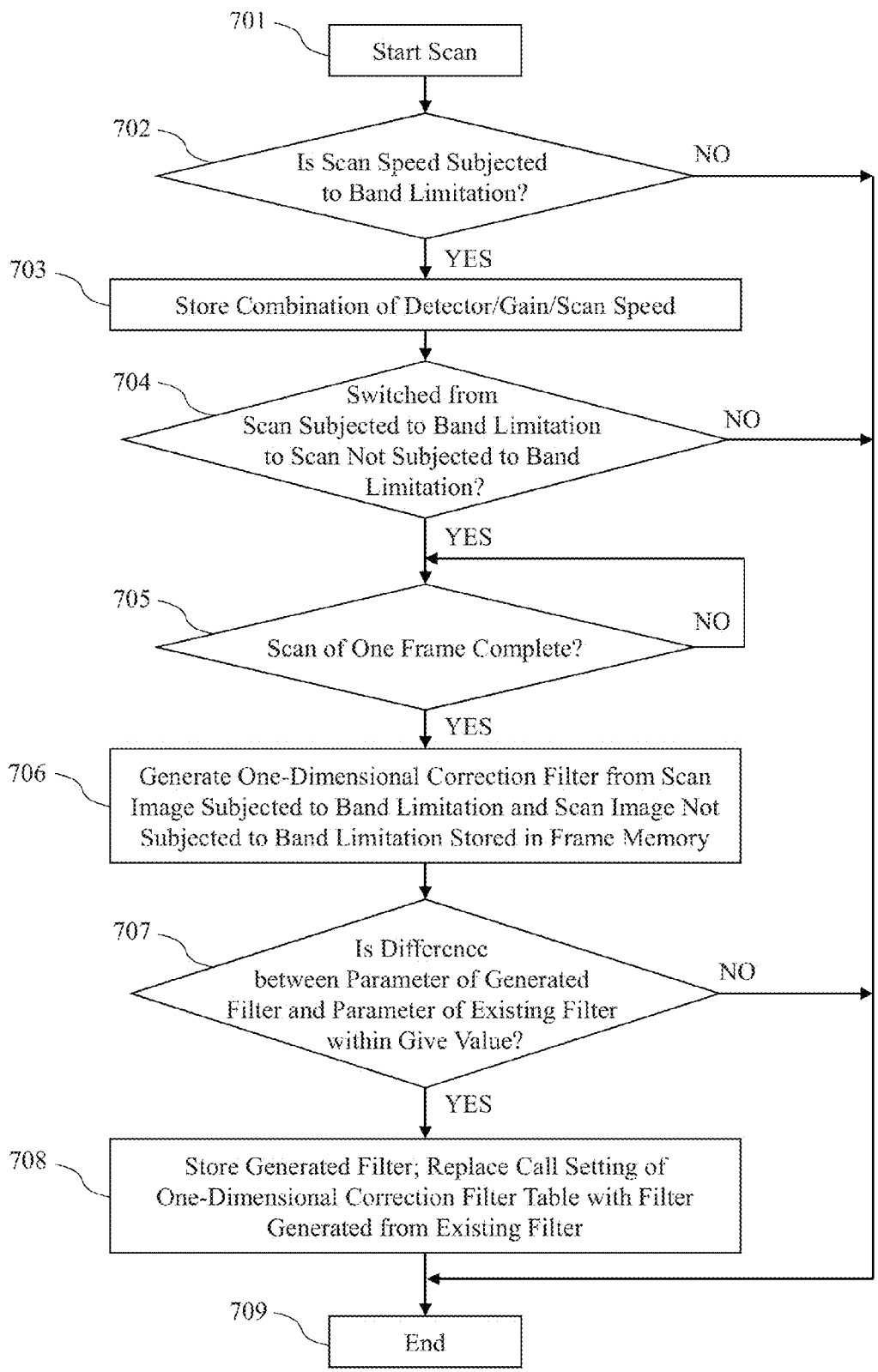
FIG. 7 is a flowchart illustrating the real-time updating procedures for a correction filter.
Figure 13:
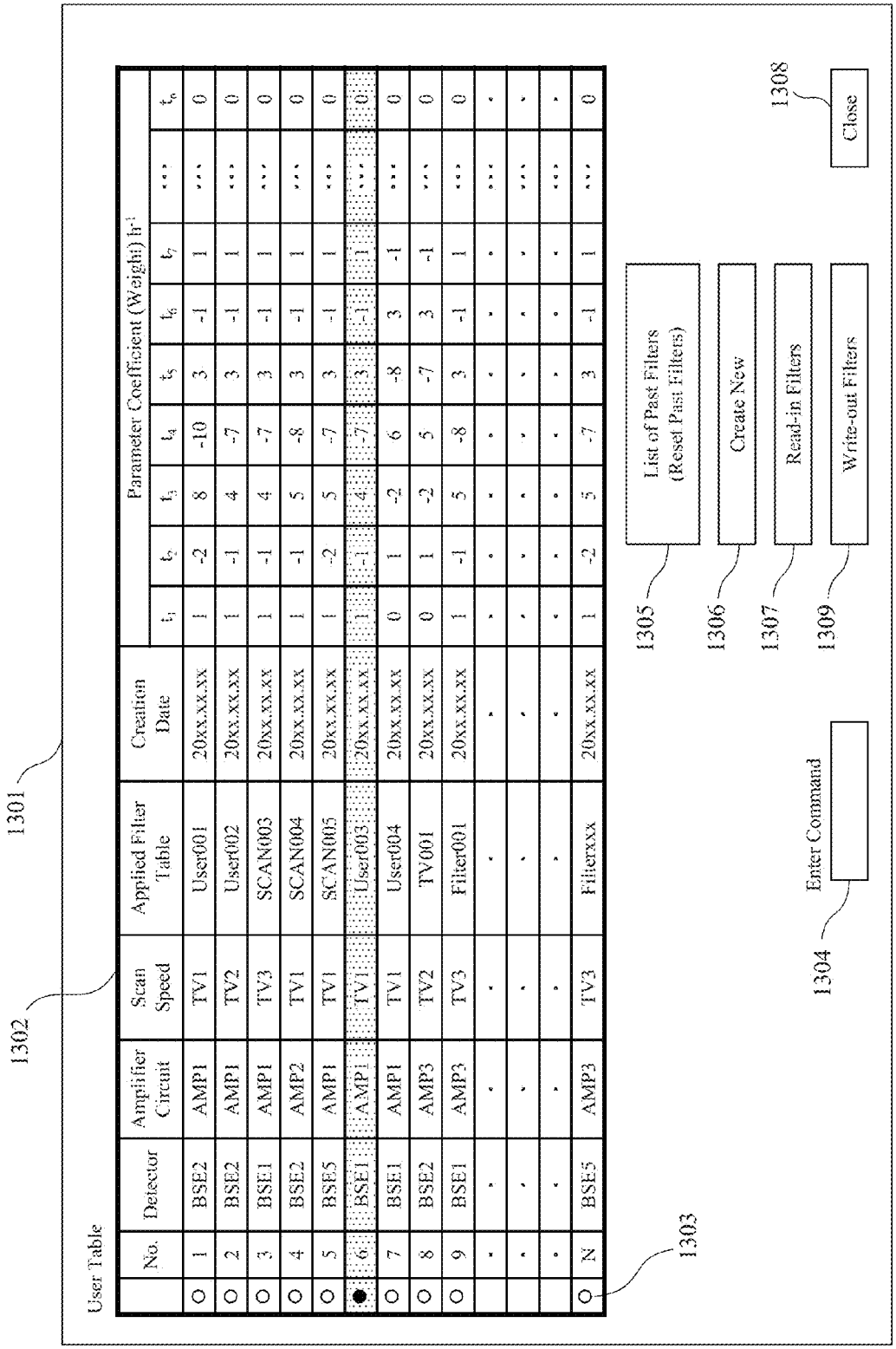
FIG. 13 is a view showing an exemplary operation screen that allows management of a user table.

FIG. 7 shows exemplary procedures of a process executed when a parameter of a one-dimensional correction filter, which is used to restore a scan image, is updated in real time. This process is also implemented via the image processing unit 124 and the information processing unit 129. However, in this embodiment, only correction filters stored in a user table are the targets to be updated. FIG. 6 shows a user table for managing user filters. In addition, a user table operation screen GUI associated with the filter update process function is shown in FIG. 13, and a user table filter list GUI is shown in FIG. 14.

When performing a batch update to correction filters described in Embodiment 1, sample observation of the operator should be interrupted or stopped. In contrast, a real-time update is executed on the background of the normal sample observation of the operator.

The series of processes shown in FIG. 7 are started upon receipt of an instruction from an operator. Herein, it is assumed that the operator is opening the main operation screen GUI 801 like the one shown in FIG. 8.

In the main operation screen GUI 801, when the operator checks the Real-Time Update in the Filter Coefficient Optimization window 811, the CPU 130 of the information processing unit 129 informs the update processing unit 128 of the image processing unit 124 and the deflection control unit 133 that the real-time update is selected.

The overall control unit 402 of the update processing unit 128 (FIG. 4), upon receiving the information, enters a real-time update mode. In addition, the overall control unit 402 starts monitoring the deflection control unit 133 via the deflection control state monitoring function 403.

The operator, after selecting the check button of the Real-Time Update, starts observation of a sample as usual (step 701). First, the operator starts to search for a visual field of the sample. The scan speed used to search for the visual field herein may be any speed. Herein, it is assumed that a search for a visual field of the sample is started through scanning at a speed subjected to the band limitation (a scan speed at which the response cannot converge).

The deflection control state monitoring function 403 that constantly monitors the deflection control unit 133 determines if the scan speed is a speed subjected to the band limitation (step 702). As described previously, in this embodiment, high-speed scanning (scanning at a speed subjected to the band limitation) is selected. Thus, the deflection control state monitoring function 403 obtains a positive result. It should be noted that when a negative result is obtained, the overall control unit 402 terminates the process. That is, the process shown in FIG. 7 is executed only when the operator's search for a visual field is performed through scanning at a speed subjected to the band limitation (i.e., high-speed scanning).

When a positive result is obtained in step 702, the deflection control state monitoring function 403 stores information about a combination of the currently used detector, amplifier circuit, and scan speed into the overall control unit 402 (step 703). It should be noted that the deflection control state monitoring function 403 continues monitoring the deflection control unit 133.

After that, the operator performs a search for a visual field through high-speed scanning by operating the information input device 134 (e.g., a track ball, a joystick, or an operation panel) or a button on a GUI (not shown). After the search for the visual field is complete, the operator switches the scanning to scanning at a speed not subjected to the band limitation (scan speed at which the response can converge) to observe a detailed structure, and starts a detailed observation of the sample. That is, the scanning electron microscope switches mode to the observation mode in which scanning is performed at a speed not subjected to the band limitation (i.e., low-speed scanning).

The deflection control state monitoring function 403 monitors the switching of the scan speed (step 704). The deflection control state monitoring function 403, upon detecting the switching of the scan speed (if the result of step 704 is positive), acquires from the frame memory 125 a scan image of one frame acquired through the high-speed scanning right before now, and stores the scan image into the internal memory function 406 or the filter generation unit 127.

Next, the deflection control state monitoring function 403 determines if the scanning of one frame through the low-speed scanning after the switching is complete (step 705). If a positive result is obtained, the deflection control state monitoring function 403 acquires from the frame memory 125 a scan image of one frame acquired through the low-speed canning performed right before now, and stores the image into the internal memory function 406 or the filter generation unit 127.

Next, the deflection control state monitoring function 403 instructs the filter generation unit 127 to calculate a one-dimensional correction filter on the basis of the high-speed scan image and the low-speed scan image stored in the memory (step 706).

After the generation of the one-dimensional correction filter, the filter update determination function 407 compares a parameter coefficient of the generated correction filter with a parameter coefficient of the existing filter corresponding to the combination of the detector, the amplifier circuit, and the scan speed stored in step 703 (step 707).

When the difference between the parameter coefficients is within a prescribed value (if the result of step 707 is positive), the filter update determination function 407 stores the generated correction filter into the memory in the image processing unit 124 or the memory 131 in the information processing unit 129. Further, the filter update determination function 407 replaces all items of the corresponding item number No. in a user table 601 with information on the newly generated correction filter (step 708). That is, the filter update determination function 407 replaces information on the existing correction filter, which is to be called in observation of a sample at a scan speed subjected to the band limitation, with information on the newly generated correction filter. After that, the overall control unit 402 terminates the series of processes (step 709).

Meanwhile, when the difference between the compared coefficients is over the prescribed value (if the result of step 707 is negative), the overall control unit 402 terminates the series of processes without storing the generated correction filter (step 709).

The prescribed value herein is prepared to determine if the generated correction filter is normal or not as in Embodiment 1. When a parameter of the generated correction filter greatly differs from a parameter value of the existing filter, it is highly likely that the difference is due to a factor other than the degradation of the detector and the amplifier circuit with time. Fluctuations of a parameter due to degradation with time depend on the types of the detector and the amplifier circuit, the update execution period, and the like. Thus, the prescribed value is desirably determined by taking them into consideration.

The aforementioned real-time update is constantly and repeatedly executed while the check button of the Real-Time Update in the Filter Coefficient Optimization window 811 is selected. That is, while an operator is observing a sample as usual, the aforementioned process operation is repeated on the background, and each time the scanning switches from high-speed scanning (scanning subjected to the band limitation) to low-speed scanning (scanning not subjected to the band limitation), a parameter of a correction filter corresponding to a combination of the detector, the amplifier circuit, and the scan speed used at that time is updated.

It should be noted that a sample observed by an operator should have a structure that includes a frequency band greater than or equal to that of the reference sample 109.

(Management Function Using Various Tables)

In this embodiment, the user table 601 (FIG. 6) and a user table display window 1302 of a user table operation screen GUI 1301 (FIG. 13) operate in conjunction with each other, and are configured such that a change in one of them is sent to the other. Thus, the table display window 1302 always displays information on the latest user table 601. The user table operation screen GUI 1301 can be called by clicking a Check User Table button 813 in the main operation screen GUI 801 (FIG. 8).

Information on the user correction filters generated or updated in the past can also be stored into the internal memory function 406, the memory 131 of the information processing unit 129, or the like as with the default filters (Embodiment 1). Needless to say, correction filters generated or updated in the past can be managed by a user table filter list GUI 1401 (FIG. 14).

The user table filter list GUI 1401 can be called through a clicking operation on a List of Past Filters button 1305 in the user table operation screen GUI 1301. The correction filters generated or updated in the past are displayed on a display window 1402 of the user table filter list GUI 1401.

When a correction filter generated in the past is to be deleted, the operator may select a check button 1403 of the corresponding correction filter and click a Delete button 1405. When the Delete button 1405 is clicked, the corresponding correction filter is deleted from the internal memory.

In addition, when a correction filter generated in the past is to be reset on the existing user table 601, the operator may select the check button 1403 of the corresponding correction filter and click a Reset button 1404. When the Reset button 1404 is clicked, the CPU 130 of the information processing unit 129 outputs an instruction to the table management function 408 to reset the filter. The table management function 408, upon receiving the instruction to reset the filter, replaces information on the corresponding correction filter in the user table 601 with information on the correction filter selected as the reset target. Accordingly, it is possible to manage correction filters generated or updated in the past and reset the correction filters on the user table 601.

By using the user table filter list GUI 1401 (FIG. 14), the operator is able to generate a correction filter having the average parameter of the plurality of selected correction filters. Generation of such a correction filter is executed in such a manner that the operator selects a plurality of check buttons 1403, and clicks a Generate Average Filter button 1407 with a new filter name filled in an entry field 1408. When the Generate Average Filter button 1407 is clicked, the update processing unit 128 computes the average value by reading parameters from the corresponding correction filters, stores the resulting correction filter with the new filter name filled in the entry field 1408 into the internal memory, and sets the filter on the user table.

(Conclusion)

As described above, the scanning electron microscope in accordance with this embodiment has mounted thereon a function of updating correction filters in real time. Thus, it is always possible to optimize the states of the correction filters without the operator being aware of it. That is, the operator is always able to observe an optimum scan image without being aware of an update performed to correction filters at all.

In addition, as the scanning electron microscope in accordance with this embodiment has various scan screen GUIs, it is also possible to improve the operability of the management of correction filters (e.g., information checking, creation, reset, deletion, and checking of the update progress).

<Embodiment 3: Generation of New Correction Filter>

Next, an embodiment related to a function of creating a new correction filter will be described. Usually, in observation of a sample, an operator first searches for a visual field at a scan speed subjected to the band limitation (scan speed at which the response cannot converge), and then switches the speed to a scan speed not subjected to the band limitation (scan speed at which the response can converge) to observe a detailed structure.

The aforementioned image restoring function is very effective in searching for a visual field. However, when the operator searches for a visual field through high-speed scanning, there are cases where a sufficiently restored image is not obtained depending on the default correction filter or the user correction filter prepared in advance.

This is because the sample structure includes a frequency band that the correction filter prepared in advance does not cover. Even in such a case, the scanning electron microscope proposed by the inventors can newly create and manage a user correction filter that is unique to a user.

Figure 16:
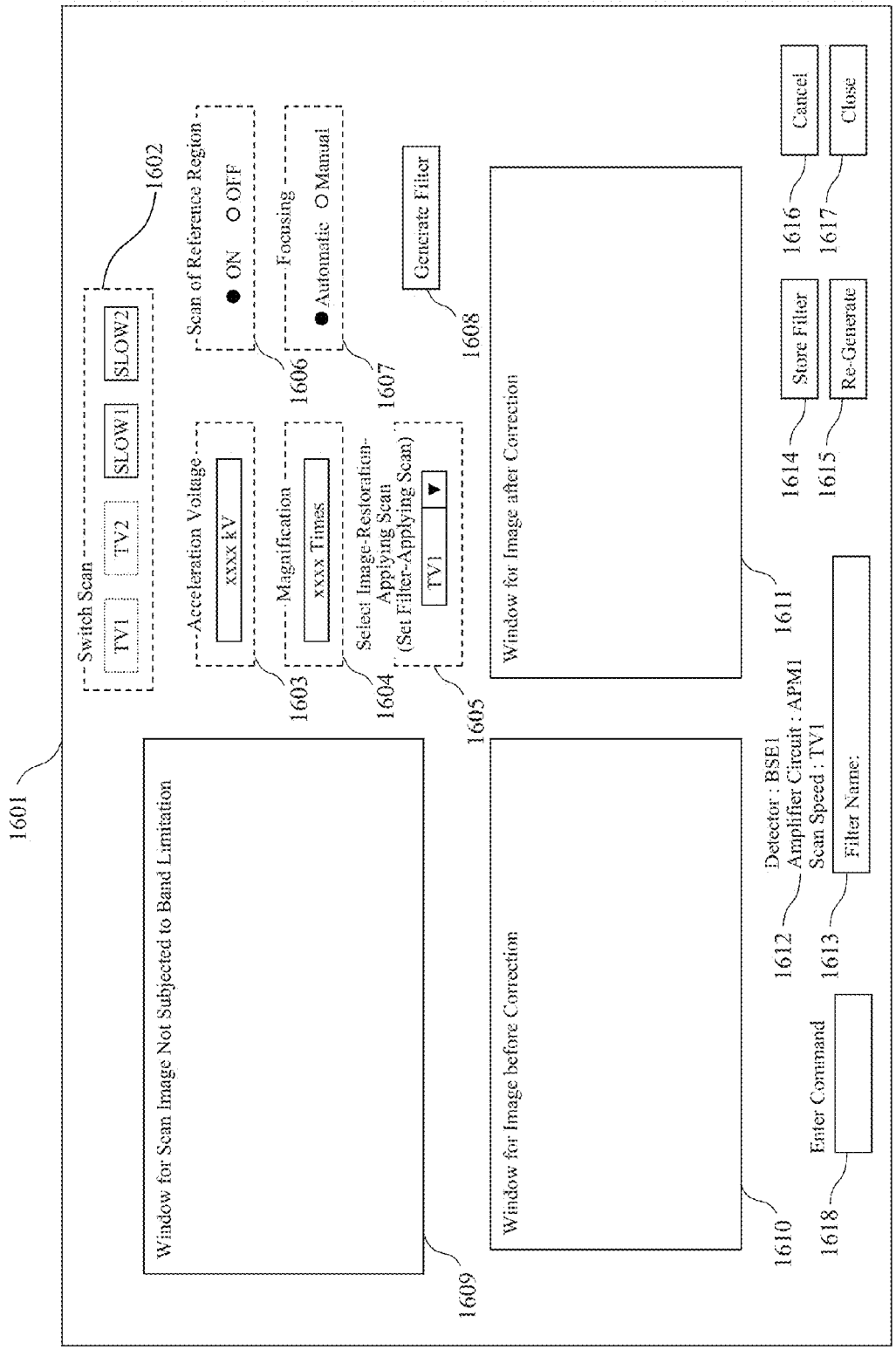
FIG. 16 is a view showing an exemplary operation screen that allows generation of a user correction filter.
Figure 18:
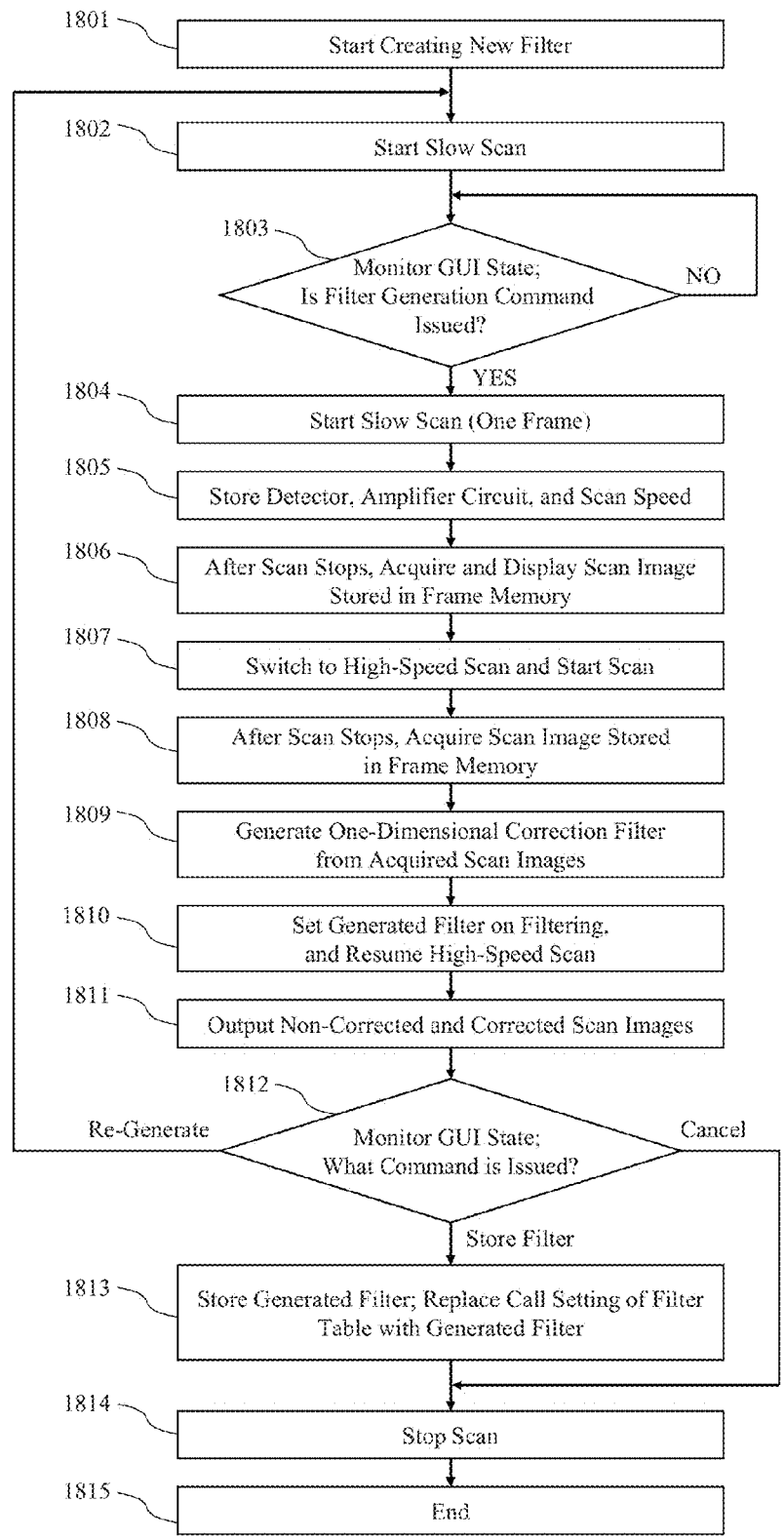
FIG. 18 is a flowchart illustrating the procedures of a correction filter generation process.

In this embodiment, it is assumed that the charged particle beam device also has the configuration shown in FIG. 1. FIG. 18 shows exemplary process procedures executed when a new correction filter is created. This process is executed when a restored image with a sufficient quality cannot be obtained such that the observed image is blurred, for example. First, an operator clicks a Create New button 810 in a Generate Filter field 808 of the main operation screen GUI 801. Then, a filter generation GUI 1601 (FIG. 16) is called (step 1801). At this time, the CPU 130 of the information processing unit 129 outputs an instruction to the update processing unit 128 to create a new filter.

The scan control function 405 (FIG. 4), upon receiving the instruction via the overall control unit 402, reads the setting of a Switch Scan field 1602, an Acceleration Voltage filed 1603, a Magnification field 1604, a Scan of Reference Region field 1606, and a Focusing field 1607 on the filter generation GUI 1601, and provides the setting to the deflection control unit 133. The deflection control unit 133 starts scanning in accordance with the provided setting. The setting read at this time corresponds to a scan speed not subjected to the band limitation.

When low-speed scanning is started, secondary signals resulting from the scanning are detected by the detectors 110 to 112 (step 1802). The detected secondary signals are displayed on a Display Window 1609 (FIG. 16) for Scan Image Not Subjected to Band Limitation via the image processing unit 124 and the information processing unit 129. The operator performs fine adjustment for a detailed observation with reference to the scan image not subjected to the band limitation (the image acquired through low-speed scanning) displayed on the scan image display window 1609. For example, fine adjustment such a movement of the visual field, scan switching, or adjustment of the acceleration voltage, magnification, or contrast is performed through a button operation on the Switch Scan field 1602, the Scan of Reference Region field 1606, the Focusing field 1607, or the like on the GUI screen, or through an operation on the information input device 134. It should be noted that the current acceleration voltage value is displayed in the Acceleration Voltage field 1603 of the filter generation GUI 1601, and the current magnification value is displayed in the Magnification field 1604.

When the operator changes the scan speed by clicking a button in the Switch Scan field 1602, the scan control function 405 instructs the deflection control unit 133 to reset the scan speed. Selection of the scan speed through the Switch Scan field 1602 is possible only at a scan speed not subjected to the band limitation.

When the operator changes the acceleration voltage via the information input device 134 or a GUI button (not shown), the overall control unit 402 instructs a control unit (not shown) for a high-voltage stabilized power supply (an electron gun power supply) to reset the acceleration voltage.

When the operator changes the magnification via the Magnification field 1604 or the like, the overall control unit 402 instructs a lens control unit (not shown) and the deflection control unit 133 to reset the magnification.

When a check button in the Scan of Reference Region field 1606 is set ON in the filter generation GUI 1601, the overall control unit 402 temporarily masks a signal input related to a coordinate movement provided from the information input device 134. After that, the overall control unit 402 controls the stage control unit 132 to move the sample stage 108 so that the reference sample 109 becomes the visual field region. After the movement, the overall control unit 402 cancels the aforementioned masking process.

When a check button in the Focusing field 1607 is set to Automatic in the filter generation GUI 1601, the overall control unit 402 instructs the lens control unit (not shown) and the image processing unit 124 to perform automatic focusing.

The overall control unit 402, upon occurrence of a change in any of the aforementioned settings, causes the scanning to resume in accordance with the changed setting, and causes a scan image acquired at a scan speed not subjected to the band limitation to be displayed in the scan image display window 1609 in real time. As described above, the update processing unit 128 always monitors the filter generation GUI 1601 and performs the same control as that in the usual sample observation.

When fine adjustment of the scan conditions is complete and the operator clicks the Generate Filter button 1608 (when a positive result is obtained in the determination process of step 1803), the update processing unit 128 causes the scanning to resume based on the setting at that point in time (step 1804). At this time, the update processing unit 128 acquires an image of one frame through low-speed scanning.

In addition, the update processing unit 128 stores information on the combination of a detector, an amplifier circuit, and a scan speed at the scan time (step 1805). Herein, a Select Image-Restoration-Applying Scan field 1605 is a field to set scanning that applies a newly generated filter (scanning subjected to the band limitation).

When scanning of one frame is complete, the update processing unit 128 acquires a scan image from the frame memory 125, and stores it into the internal memory function 406 or the filter generation unit 127. In addition, the update processing unit 128 transfers the scan image of one frame to the information processing unit 129, and causes the monitor of the information transmission device 135 to display the image as a still image (step 1806). That is, the update processing unit 128 causes the Display Window 1609 for Scan Image Not Subjected to Band Limitation of the filter generation GUI 1601 (FIG. 16) to display the scan image of one frame.

After that, the scan control function 405 in the update processing unit 128 switches the scan speed of the deflection control unit 133 to high-speed scanning subjected to the band limitation that has been selected in the Select Image-Restoration-Applying Scan filed 1605 in step 1805, and starts a scan operation (step 1807). At this time, needless to say, the detector and the amplifier circuit are not changed, and, the setting for a visual field such as the coordinates and magnification is not changed, either.

When scanning of one frame is complete, the overall control unit 402 acquires a scan image from the frame memory 125, and stores it into the internal memory function 406 or the filter generation unit 127 (step 1808).

After that, the overall control unit 402 instructs the filter generation unit 127 to generate a one-dimensional correction filter from the acquired scan images (step 1809).

When generation of the correction filter is complete, the update processing unit 128 sets the generated filter on the filtering unit 126, and starts scanning based on the same setting as that in step 1807 (step 1810). That is, the update processing unit 128 captures an image through high-speed scanning. The detected image is input to the image processing unit 124.

The image processing unit 124 transfers the scan image after correction and the scan image before correction to the information processing unit 129 in real time through time division or expansion of the transfer data width (step 1811). The information processing unit 129 displays the scan image before correction and the scan image after correction in a Window 1610 for Image before Correction and a Window 1611 for Image after Correction, respectively, of the filter generation GUI 1601 in real time via the information transmission device 135.

Consequently, the operator is able to refer to the image 1609 acquired through low-speed scanning (scanning performed at a speed not subjected to the band limitation) as well as the image 1610 before filter correction and the image 1611 after filter correction, which have been acquired through high-speed scanning (scanning performed at a speed subjected to the band limitation), on the same screen. Thus, the correction effect of the correction filter can be checked. When the operator wishes to store the generated correction filter and replace the relevant user table 601, he/she may fill in a filter name in a Filter Name 1613 and click a Store Filter button 1614.

When the operator determines that generation of a correction filter should be started from the beginning again, he/she clicks a Re-Generate button 1615. The overall control unit 402, upon detecting the click input, returns the process step to step 1802 (step 1812). Meanwhile, if the operator wishes to terminate the filter generation process without storing the generated correction filter, he/she clicks a Cancel button 1616 (step 1812). The overall control unit 402, upon detecting the click input, skips step 1813 and proceeds to step 1814. Meanwhile, if the operator determines that the filter should be stored, he/she clicks the Store Filter button 1614. The overall control unit 402, upon detecting the click input, stores the generated correction filter into the memory in the image processing unit 124 or the memory 131 in the information processing unit 129. In addition, the overall control unit 402 replaces all items of a filter of the corresponding item No. in the user table 601 with information on the generated correction filter (step 1813).

After that, the update processing unit 128 stops the scan operation (step 1814), and terminates the filter generation process (step 1815). At this time, the display field 1612 of the filter generation GUI 1601 displays information on the currently used detector, amplifier circuit, and scan speed.

The aforementioned description illustrates a case where moving images are displayed on the screen in step 1811. However, when real-time transfer of the acquired images is difficult to perform, still images may be displayed.

When the Close button 1617 is clicked, the current GUI, that is, the filter generation GUI 1601 is closed as with the other GUIs.

(Conclusion)

As described above, as the scanning electron microscope in accordance with this embodiment has mounted thereon a function of creating a new correction filter, it is always possible to restore an image using an optimal correction filter.

The scanning electron microscope in accordance with this embodiment can also facilitate the operator's management of correction filters by preparing various GUIs. In particular, by allowing both images, to which a correction filter is applied and not applied, to be viewed on the same screen together with a low-speed scan image not subjected to the band limitation, it is possible to allow the effect of the created correction filter to be checked.

<Embodiment 4: Another Embodiment>

(1) In Embodiments 1, 2, and 3 described above, it is assumed that correction filters are created for a number of lines in one frame, and the filters that are present in a number corresponding to the number of the lines are internally averaged automatically, so that a single correction filter is created. However, the method of creating a correction filter is not limited thereto. For example, it is also possible to create a single correction filter only from information on one line in one frame. It is also possible to create a single correction filter by creating filters only from information on odd lines and average the filters for the lines. In practice, when a selected line includes all frequency bands that are included in the sample to be observed, a single correction filter may be generated only from information on one line. For a method of generating a correction method, an optimum method may be selected taking into consideration the reliability (structure distribution in terms of the frequency band of the sample to be observed) of the correction filter, throughput in calculation of a correction filter, and the like.

(2) The filter generation GUI 1601 (FIG. 16) may also be configured such that it can be called upon click of a Create New button 1306 on the user table operation screen GUI 1301 (FIG. 13).

(3) When a Read-in Filters button 1307 on the user table operation screen GUI 1301 (FIG. 13) is clicked, the update processing unit 128 may read correction filters from an external storage medium (not shown) that is externally connected through the information processing unit 129, and then store the correction filters into the internal memory.

(4) When a Write-out Filters button 1309 on the user table operation screen GUI 1301 (FIG. 13) is clicked, the update processing unit 128 may transfer the correction filters stored in the internal memory to an external storage medium (not shown) that is externally connected to the information processing unit 129.

(5) The image restoring function in accordance with the specification of this application differs from that in Patent Literature 1 in that restoration of the image degradation is performed on the basis of a transfer function of a path from a detector to a digital image processor (mainly, a detector and an amplifier), and in that a scan image obtained at a scan speed in which the response of the transfer function can converge (a scan speed not subjected to the band limitation) is restored from a scan image obtained at a scan speed in which the response of the transfer function cannot converge (a scan speed subjected to the band limitation).

It should be noted that Patent Literature 1 discloses an update processing method for a degradation function that includes: generating a degradation function from the image capturing conditions and sample information, and after applying the function to the captured image, modifying the degradation function again in accordance with the degree of the restored image to execute image restoration again. In contrast, the image restoring function in accordance with the specification of this application differs from the method of Patent Literature 1 in that it is related to a processing method that includes updating a parameter of a correction filter, which changes with degradation of a transfer function with time, to an optimum value. In addition, the image restoring function in accordance with this specification also differs from the method of Patent Literature 1 in that image restoration is performed by determining a degradation function from two images acquired at different scan speeds as described previously. Further, the image restoring function in accordance with this specification also differs from the method of Patent Literature 1 in that it is related to an update process for correction filters such as a batch update or a real-time update.

(6) For the charged particle beam device in accordance with this embodiment, two types of tables, which are a default table and a user table, are prepared as the tables for managing correction filters. As described previously, default correction filters are managed by the default table, and user correction filters created by a user are managed by the user table.

The default correction filters indicate default correction filters at factory shipment, and correction filters created by updating such filters. The default correction filters at factory shipment cannot be deleted by a user. Meanwhile, the user correction filters indicate filters created by a user and correction filters created by updating such filters.

In usual sample observation to which high-speed scanning is applied, a user is able to select which of the two filter tables should be applied. For example, it is possible to switch between the tables by selecting a check button in the Applied Filter Table field 806 displayed in the main operation screen GUI 801 (FIG. 8).

In order to implement such a function, the update processing unit 128 monitors the check buttons in the Applied Filter Table field 806. The update processing unit 128, upon detecting switching of the check button, immediately applies the selected table and a correction filter, which corresponds to the combination of a detector, an amplifier circuit, and a scan speed, to the filtering unit 126.

The type of the table and the information on the correction filter that are currently applied can be easily checked through the display of the filter name display fields 802 and 805 while the main operation screen GUI 801 is being applied.

It should be noted that when an operator selects the user table, if the user table does not contain a correction filter for a combination (a detector, an amplifier circuit, and a scan speed) of the scanning corresponding to the current system configuration, a default correction filter may be automatically called and applied from the default table via the information processing unit 129 or the like.

(7) Each table may also be set in a batch in accordance with the following procedures. First, an operator clicks the Set Table field 809 in the Filter Setting window 807 of the main operation screen GUI 801. Then, a table setting GUI 1501 (FIG. 15) is called up on the screen. First, the operator selects a table to be set by checking the Select Table field 1502. This selection is provided to the image processing unit 124 via the information processing unit 129. This is also true of the following operation input.

Next, the operator operates each pull-down of the detector, the amplifier circuit, and the scan speed in a Combination Pattern field 1503 to select a combination to be set. The update processing unit 128 always monitors the Select Table field 1502 and the Combination Pattern field 1503. The update processing unit 128 controls the amplifier switching circuit 122 so that the selected detector and amplifier circuit are located on the path of the detected signal. In addition, the update processing unit 128 controls the deflection control unit 133 to attain the selected scan speed.

After that, the update processing unit 128 calls the corresponding correction filter from the table selected by the operator, from the internal memory function 406 or the memory 131 in the information processing unit 129, and sets the correction filter on the filtering unit 126.

Next, the update processing unit 128 starts a scan operation at the scan speed set in the Combination Pattern field 1503. At this time, the update processing unit 128 displays a scan image obtained through the existing correction filter on a Window 1505 for Existing Corrected Image, and displays the name of the corresponding correction filter in the set filter name field 1504.

At the same time, the update processing unit 128 reads all of correction filters created or updated in the past in the table selected in the Select Table field 1502, which have a correction pattern that coincides with the combination pattern of the detector, the amplifier circuit, and the scan speed set in the Combination Pattern Field 1503, from the internal memory function 406 or the memory 131 in the information processing unit 129, and displays the list in a list display window 1509.

Figure 15:
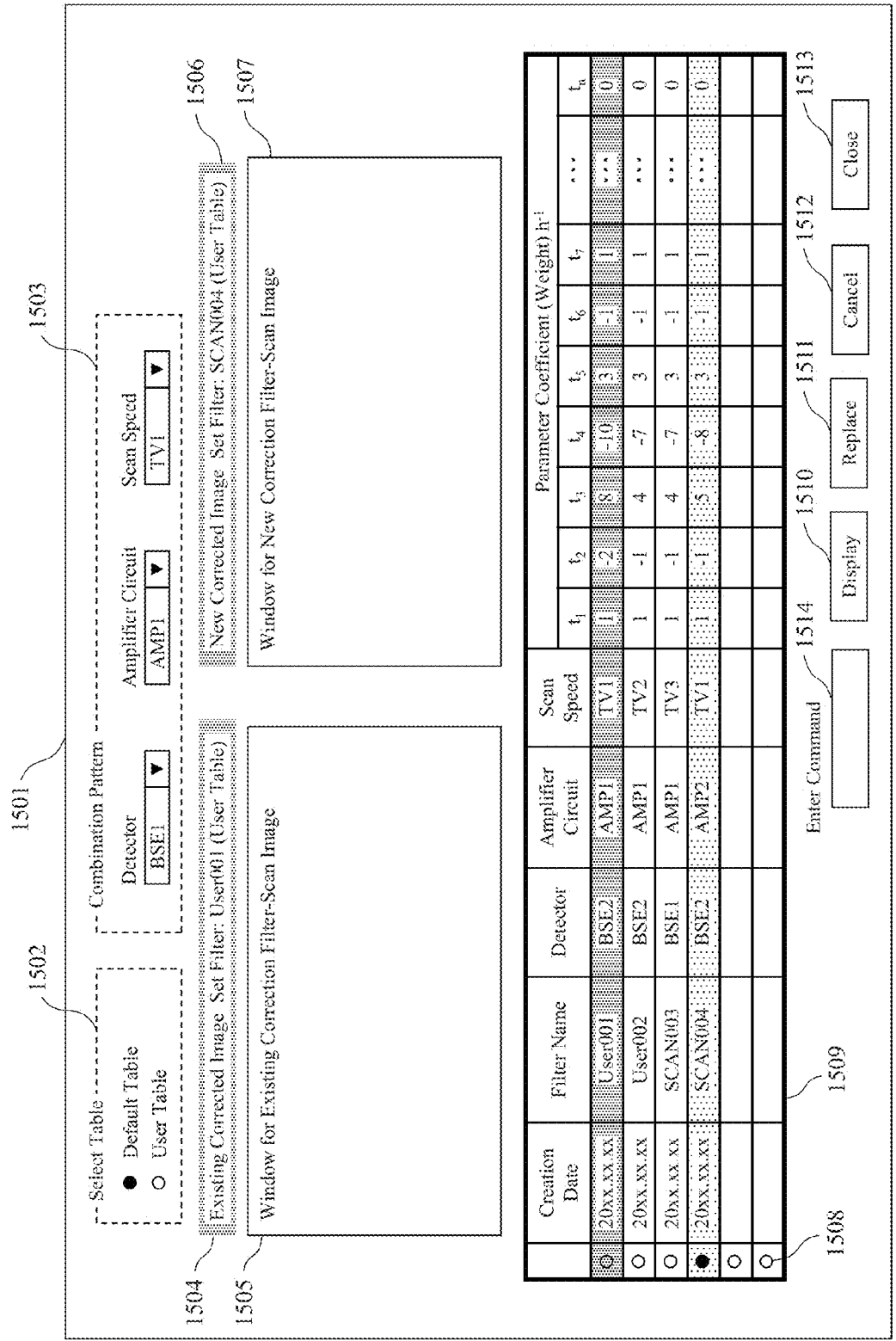
FIG. 15 is a view showing an exemplary operation screen that allows setting of a table of correction filters.

In FIG. 15, the currently set filter is shown by dark hatching. It is also possible to represent the display color or luminance of the currently set filter by a different color or luminance from other filters.

In addition, the operator is always able to adjust a scan image as in the usual observation by entering an operation using a track ball, a joystick, a panel, or another information input device 134, or operating a button on a GUI (not shown).

Next, the operator selects one of the correction filters displayed in the list of the list display window 1509 (e.g., selects a check button 1508), and clicks a Display button 1510. Then, the update processing unit 128 causes the information processing unit 129 to capture the scan image and causes the Window 1505 for Existing Corrected Image to display the scan image as a still image.

Next, the update processing unit 128 sets the correction filter selected by the check button 1508 on the filtering unit 126, and starts scanning of one frame. When the scanning stops, the update processing unit 128 causes a Window 1507 for New Corrected Image to display the captured scan image via the information processing unit 129, and displays the name of the corresponding correction filter in the set filter name field 1506.

Consequently, the image display window 1505 of the table setting GUI 1501 displays the scan image corrected through the filter registered in the table corresponding to the setting of 1502 and 1503, while the image display window 1507 displays the scan image corrected through the filter selected from 1509. That is, the scan images corrected through the respective filters are displayed side by side. The operator compares the two images on the screen to determine the effect of correction.

In addition, the operator, on the basis of the determination result, determines whether or not the correction filter set on the current table should be replaced with the correction filter selected from the list display window 1509. Herein, if the operator determines that replacement is necessary, he/she clicks a Replace button 1511. Accordingly, the table is replaced with the newly selected correction filter. Meanwhile, if the operator determines that the function of another correction filter is to be checked, he/she selects another correction filter with the check button 1508, and clicks the Display button 1510.

It should be noted that when the operator clicks a Cancel button 1512, the process returns to the selection phase of the Select Table field 1502. When the operator clicks a Close button 1513, the present process terminates, and the process returns to the main operation screen GUI 801.

As described above, using the table setting GUI 1501 can easily construct a table while at the same time allowing the function of a filter to be checked on the screen from among a number of the existing correction filters.

Although still images are used for the comparison of the scan images in the aforementioned description, it is also possible to prepare filtering units 126 for two channels. In such a case, by setting the existing correction filter registered in the table on one of the filtering units 126 and setting a newly selected correction filter on the other filtering unit 126, and further outputting information on the two channels from the output unit of the image processing unit 124 at the same time through time division or expansion of the transfer data width, it becomes possible to cause the information processing unit 129 to display the scan images in real time. In such a case, comparison of the scan images can be performed based on moving images.

(8) In the aforementioned embodiment, the image processing unit 124 basically implements each function through software processing, but may also implement each function through hardware. Alternatively, the processing function of the image processing unit 124 may be implemented through software processing of the CPU 130 of the information processing unit 129.

(9) The aforementioned embodiment illustrates a case where instructions are basically issued upon click of various buttons arranged on the GUI screen, but instructions may also be issued through direct input of a command.

(10) The aforementioned embodiment illustrates a case where the present invention is applied to a snorkel-lens SEM (Scanning Electron Microscope). However, needless to say, the present invention can also be applied to other types of SEMS such as an out-lens SEM and an in-lens SEM. Further, the present invention can be applied not only to SEM but also to STEM (Scanning Transmission Electron Microscopy). Further, the present invention can also be applied to a FIB (Focused Ion Beam) processing apparatus in which charged particles are ions.

(11) A screen that displays a scan image, to which a correction filter is not yet applied, and a scan image, to which the correction filter is applied, side by side may be configured such that it can be displayed any time when the effect of the correction filter is to be checked.

(12) The present invention is not limited to the aforementioned embodiments, and includes various variations. For example, although the aforementioned embodiments have been described in detail to clearly illustrate the present invention, the present invention need not include all of the structures described in the embodiments. It is possible to replace a part of a structure of an embodiment with a structure of another embodiment. In addition, it is also possible to add, to a structure of an embodiment, a structure of another embodiment. Further, it is also possible to, for a part of a structure of each embodiment, add/remove/substitute a structure of another embodiment.

Some or all of the aforementioned structures, functions, processing units, processing means, and the like may be implemented by hardware through designing of an integrated circuit, for example. Alternatively, each of the aforementioned structures, functions, and the like may be implemented by software so that a processor analyzes and executes a program that implements each function. Information such as the program that implements each function, tables, and files can be placed on a storage device such as memory, a hard disk, or a SSD (Solid State Drive); or a storage medium such as an IC card, an SD card, or a DVD.

In addition, the control lines and information lines represent those that are considered to be necessary for the description, and do not necessarily represent all control lines and information lines that are necessary for a product. In practice, almost all structures may be considered to be mutually connected.

REFERENCE SIGNS LIST

101 Vacuum column
102 Electron gun
103 Electron beam
104 Converging lens
105 Deflection coil
106 Objective lens
107 Sample
108 Sample stage
109 Reference sample
110-112 Detectors
113-121 Amplifiers
122 Amplifier switching circuit
123 ADC
124 Image processing unit
125 Frame memory
126 Filtering unit
127 Filter generation unit
128 Update processing unit
129 Information processing unit
130 CPU
131 Memory
132 Stage control unit
133 Deflection control unit
134 Information input device
135 Information transmission device

The invention claimed is:

1. A charged particle beam device comprising:
a charged particle beam source that generates a charged particle beam;
means for detecting a secondary signal generated from a sample upon irradiation of the sample with the charged particle beam;
means for converting the secondary signal into an electrical signal;
means for amplifying a signal amplitude of the electrical signal;
means for controlling a scan speed of the charged particle beam;
means for calculating a degradation function between a first electrical signal and a second electrical signal, the first electrical signal being acquired when the charged particle beam is scanned at a first speed, which results in the first electrical signal being subjected to a band limitation of an electrical signal path, and the second electrical signal being acquired when the charged particle beam is scanned at a second speed, which does not result in the second electrical signal being subjected to the band limitation of the electrical signal path;

means for calculating an inverse function of the degradation function as a correction filter;

means for generating the second electrical signal by applying the correction filter to the first electrical signal; and means for updating the correction filter, wherein
the degradation function is calculated using the first electrical signal and the second electrical signal by quantifying the degradation of the first electrical signal as compared to the second electrical signal.

2. The charged particle beam device according to claim 1, wherein the degradation function is an inverse Fourier transform of a function obtained by dividing a Fourier transform of the second electrical signal by the Fourier transform of the first electrical signal.

3. The charged particle beam device according to claim 1, further comprising:
a memory storing multiple correction filters for use with different scanning conditions, wherein
the stored correction filters are updated in a batch by a function of the means for updating the correction filter.

4. The charged particle beam device according to claim 1, wherein the means for updating the correction filter has a function of selectively updating one or more given selected correction filters.

5. The charged particle beam device according to claim 1, wherein the means for updating the correction filter has a function of updating a correction filter being used on a background of sample observation.

6. The charged particle beam device according to claim 1, further comprising means for, in sample observation, informing an operator of information that identifies a correction filter being used.

7. The charged particle beam device according to claim 1, further comprising means for managing the correction filter using a table.

8. The charged particle beam device according to claim 1, further comprising means for transferring or inputting the correction filter to a storage medium externally connected via an information processing device.

9. The charged particle beam device according to claim 2, further comprising means for displaying an image, to which the correction filter is not yet applied, and an image, to which the correction filter is applied, on the display screen in accordance with an operation input.

10. The charged particle beam device according to claim 2, further comprising:

a memory storing multiple correction filters for use with different scanning conditions, wherein
the stored correction filters are updated in a batch by a function of the means for updating the correction filter therein the means for updating the correction filter has a function of updating all correction filters in a batch.

11. The charged particle beam device according to claim 2, wherein the means for updating the correction filter has a function of selectively updating one or more given selected correction filters.

12. The charged particle beam device according to claim 2, wherein the means for updating the correction filter has a function of updating a correction filter being used on a background of sample observation.

13. The charged particle beam device according to claim 2, further comprising means for, in sample observation, informing an operator of information that identifies a correction filter being used.

14. The charged particle beam device according to claim 2, further comprising means for managing the correction filter using a table.

15. The charged particle beam device according to claim 2, further comprising means for transferring or inputting the correction filter to a storage medium externally connected via an information processing device.

16. A method for correcting a detected signal of a charged particle beam device, comprising the processes of:
generating a charged particle beam from a charged particle beam source;
detecting a secondary signal generated from a sample upon irradiation of the sample with the charged particle beam;
converting the secondary signal into an electrical signal;
amplifying a signal amplitude of the electrical signal;
controlling a scan speed of the charged particle beam;
calculating a degradation function between a first electrical signal and a second electrical signal, the first electrical signal being acquired when the charged particle beam is scanned at a first speed, which results in the first electrical signal being subjected to a band limitation of an electrical signal path, and
the second electrical signal being acquired when the charged particle beam is scanned at a second speed, which does not result in the second electrical signal being subjected to the band limitation of the electrical signal path;
calculating an inverse function of the degradation function as a correction filter;
generating a reconstructed the second electrical signal by applying the correction filter to the first electrical signal; and
updating the correction filter, wherein
the degradation function is calculated using the first electrical signal and the second electrical signal by quantifying the degradation of the first electrical signal as compared to the second electrical signal.

* * * * *